(12) United States Patent
Moitzi et al.

(10) Patent No.: US 10,720,405 B2
(45) Date of Patent: Jul. 21, 2020

(54) SEMIFINISHED PRODUCT AND COMPONENT CARRIER

(71) Applicant: AT&S Austria Technologie & Systemtechnik Aktiengesellschaft, Leoben (AT)

(72) Inventors: Heinz Moitzi, Zeltweg (AT); Dietmar Drofenik, Spielberg (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/092,917

(22) PCT Filed: Apr. 7, 2017

(86) PCT No.: PCT/EP2017/058446
§ 371 (c)(1),
(2) Date: Oct. 11, 2018

(87) PCT Pub. No.: WO2017/178382
PCT Pub. Date: Oct. 19, 2017

(65) Prior Publication Data
US 2019/0157242 A1    May 23, 2019

(30) Foreign Application Priority Data
Apr. 11, 2016  (DE) .................... 10 2016 106 633

(51) Int. Cl.
*H01L 23/31* (2006.01)
*H01L 23/49* (2006.01)
(Continued)

(52) U.S. Cl.
CPC ............ *H01L 24/97* (2013.01); *H01L 21/486* (2013.01); *H01L 21/4857* (2013.01);
(Continued)

(58) Field of Classification Search
CPC ......... H01L 24/97; H01L 24/05; H01L 24/19; H01L 24/20; H01L 23/3121; H01L 23/49822
See application file for complete search history.

(56) References Cited

U.S. PATENT DOCUMENTS 5,224,265 A * 7/1993 Dux .................... H01L 21/4857
                                                  257/E23.172
6,292,366 B1 * 9/2001 Platt .................... H01L 23/427
                                                  174/252
(Continued)

FOREIGN PATENT DOCUMENTS

DE    10 2006 036 728 A1    2/2008
DE    10 2011 000 751 A1    12/2011
(Continued)

*Primary Examiner* — Ida M Soward
(74) *Attorney, Agent, or Firm* — Robert A. Blaha; Smith Tempel Blaha LLC

(57) ABSTRACT

A semifinished product includes a base structure, wafer structures, a cover structure and a further cover structure. The base structure has an electrically conductive layer and/or an electrically insulating layer. The wafer structures are on the base structure and have electronic components. The cover structure has at least one further layer and covers the wafer structures and part of the base structure. Separate electronic components are arranged on the cover structure and a further cover structure is provided to cover the separate electronic components and part of the cover structure. A component carrier includes a bare die with pads. The bare die is laminated between a base laminate and a cover laminate and has a lateral semiconductor surface being exposed from the base laminate and the cover laminate. A redistribution layer increases spacing of external electric contacts relative to spacing between pads of the bare die.

3 Claims, 12 Drawing Sheets

(51) Int. Cl.

| | | |
|---|---|---|
| *H01L 23/00* | (2006.01) | |
| *H01L 21/56* | (2006.01) | |
| *H01L 21/683* | (2006.01) | |
| *H01L 23/538* | (2006.01) | |
| *H01L 21/48* | (2006.01) | |
| *H01L 23/498* | (2006.01) | |

(52) U.S. Cl.
CPC .......... *H01L 21/561* (2013.01); *H01L 21/568* (2013.01); *H01L 21/6835* (2013.01); *H01L 23/3114* (2013.01); *H01L 23/3121* (2013.01); *H01L 23/49822* (2013.01); *H01L 23/5389* (2013.01); *H01L 24/03* (2013.01); *H01L 24/05* (2013.01); *H01L 24/19* (2013.01); *H01L 24/20* (2013.01); *H01L 24/94* (2013.01); *H01L 2221/68345* (2013.01); *H01L 2221/68359* (2013.01); *H01L 2221/68372* (2013.01); *H01L 2224/0231* (2013.01); *H01L 2224/02371* (2013.01); *H01L 2224/02379* (2013.01); *H01L 2224/03002* (2013.01); *H01L 2224/04042* (2013.01); *H01L 2224/04105* (2013.01); *H01L 2224/05548* (2013.01); *H01L 2224/06181* (2013.01); *H01L 2224/08225* (2013.01); *H01L 2224/211* (2013.01); *H01L 2224/2518* (2013.01); *H01L 2224/48091* (2013.01); *H01L 2224/48227* (2013.01); *H01L 2224/73265* (2013.01); *H01L 2224/73267* (2013.01); *H01L 2224/94* (2013.01); *H01L 2224/95001* (2013.01); *H01L 2924/14* (2013.01); *H01L 2924/1427* (2013.01); *H01L 2924/1431* (2013.01); *H01L 2924/1434* (2013.01); *H01L 2924/3025* (2013.01); *H01L 2924/3511* (2013.01)

(56) References Cited

U.S. PATENT DOCUMENTS

| | | | | |
|---|---|---|---|---|
| 7,505,282 | B2* | 3/2009 | Chang | H01L 23/5389 361/761 |
| 7,507,915 | B2* | 3/2009 | Chang | H01L 23/3121 174/260 |
| 7,674,986 | B2* | 3/2010 | Chang | H05K 1/162 174/260 |
| 7,697,301 | B2* | 4/2010 | Lee | H01L 23/5389 361/763 |
| 8,168,893 | B2* | 5/2012 | Ito | H01L 23/49838 174/260 |
| 8,420,954 | B2* | 4/2013 | Lin | H05K 1/0203 174/15.1 |
| 8,841,209 | B2* | 9/2014 | Allard | H05K 3/4682 257/758 |
| 8,946,055 | B2* | 2/2015 | Sakamoto | B28D 5/0011 438/463 |
| 9,564,391 | B2* | 2/2017 | Hu | H01L 23/36 |
| 9,666,539 | B1* | 5/2017 | Li | H01L 23/562 |
| 10,312,007 | B2* | 6/2019 | Roy | H01F 17/0013 |
| 10,468,352 | B2* | 11/2019 | Lee | H01L 21/4857 |
| 2005/0112798 | A1* | 5/2005 | Bjorbell | H01L 23/5385 438/106 |
| 2006/0191711 | A1* | 8/2006 | Cho | H01L 23/5389 174/260 |
| 2008/0106879 | A1* | 5/2008 | Ryu | H01L 23/5389 361/783 |
| 2008/0196931 | A1* | 8/2008 | Lee | H01L 23/49822 174/260 |
| 2010/0072588 | A1* | 3/2010 | Yang | H01L 23/49816 257/676 |
| 2011/0227190 | A1 | 9/2011 | Chang et al. | |
| 2011/0254155 | A1* | 10/2011 | Lin | H01L 21/6835 257/737 |
| 2011/0316140 | A1* | 12/2011 | Nalla | H01L 23/5389 257/698 |
| 2013/0284506 | A1 | 10/2013 | Zanma et al. | |
| 2014/0175657 | A1* | 6/2014 | Oka | H01L 23/5389 257/773 |
| 2014/0183761 | A1 | 7/2014 | Lin et al. | |
| 2015/0014034 | A1 | 1/2015 | Hwang et al. | |
| 2017/0170105 | A1* | 6/2017 | Yao | H01L 24/97 |
| 2019/0088636 | A1* | 3/2019 | Gamini | H01L 25/18 |
| 2019/0121952 | A1* | 4/2019 | Huang | G06F 21/32 |

FOREIGN PATENT DOCUMENTS

| | | |
|---|---|---|
| EP | 1 304 742 A2 | 4/2003 |
| EP | 2 854 168 A2 | 4/2015 |
| JP | 2012 209 432 A | 10/2012 |
| JP | 2014 127 716 A | 7/2014 |
| WO | WO 2015/003068 A1 | 1/2015 |
| WO | WO 2015/172729 A1 | 11/2015 |

* cited by examiner

SEMIFINISHED PRODUCT AND COMPONENT CARRIER

TECHNICAL FIELD

The invention relates to methods of manufacturing a batch of component carriers. Furthermore, the invention relates to semifinished products and to a component carrier.

TECHNOLOGICAL BACKGROUND

Along with the development of electronic industries, electronic products have a trend towards miniaturization and high performance, and accordingly multi-layer boards are developed so as to increase the layout area for the layout through interlayer connection techniques, and meet demands for high-density integrated circuits and meanwhile reduce the thickness of packaging substrates. In modern applications of component carrier technology, sophisticated electronic functionality is implemented.

Although existing methods of manufacturing component carriers are powerful, there is still room for improvement in terms of simplifying the manufacturing process.

SUMMARY

There may be a need to enable the manufacture of reliable component carriers with reasonable manufacturing effort.

Methods of manufacturing a batch of component carriers, and semifinished products according to the independent claims are provided.

According to an exemplary embodiment of the invention, a method of manufacturing a batch of component carriers is provided, wherein the method comprises providing a plurality of separate wafer structures, each comprising a plurality of electronic components, simultaneously laminating the wafer structures with at least one electrically conductive layer structure and at least one electrically insulating layer structure, and singularizing a structure resulting from the laminating into the plurality of component carriers, each comprising at least one of the electronic components, a part of the at least one electrically conductive layer structure and a part of the at least one electrically insulating layer structure.

According to another exemplary embodiment of the invention, a method of manufacturing a batch of component carriers is provided, wherein the method comprises arranging a plurality of separate electronic components, configured as bare dies with pads, on a common panel, simultaneously laminating the panel, the electronic components and at least one electrically conductive layer structure and at least one electrically insulating layer structure on the active region of the electronic components to thereby form a redistribution layer on the bare dies, and singularizing a structure resulting from the laminating into the plurality of component carriers, each comprising a part of the panel, at least one of the electronic components, a part of the at least one electrically conductive layer structure and a part of the at least one electrically insulating layer structure.

According to still another exemplary embodiment of the invention, a semifinished product is provided which comprises a laminate of a base structure comprising at least one electrically conductive layer structure and/or at least one electrically insulating layer structure, a plurality of separate wafer structures, each comprising a plurality of electronic components, arranged on the base structure, and a cover structure comprising at least one further electrically conductive layer structure and/or at least one further electrically insulating layer structure and being arranged to cover the wafer structures and part of the base structure.

According to yet another exemplary embodiment of the invention, a semifinished product is provided which comprises a laminate of a base structure having (or in form of) a common panel comprising at least one electrically conductive layer structure and/or at least one electrically insulating layer structure, a plurality of separate electronic components, configured as bare dies with pads, on the common panel, and a cover structure comprising at least one further electrically conductive layer structure and/or at least one further electrically insulating layer structure and being arranged to cover the electronic components and part of the base structure, wherein at least part of the one or more electrically conductive layer structures and/or at least part of the one or more electrically insulating layer structures form a redistribution layer on the bare dies.

According to yet another exemplary embodiment of the invention, a component carrier is provided which comprises a base laminate comprising a laminated stack of at least one electrically conductive layer structure and/or at least one electrically insulating layer structure, a cover laminate comprising a laminated stack of at least one electrically conductive layer structure and/or at least one electrically insulating layer structure, and a bare die (or a plurality of bare dies) with one or more pads, wherein the bare die is laminated between the base laminate and the cover laminate and has a lateral semiconductor surface being exposed from the base laminate and the cover laminate.

According to yet another exemplary embodiment of the invention, a component carrier is provided which comprises a base structure comprising at least one electrically conductive layer structure and/or at least one electrically insulating layer structure, a cover structure comprising a laminated stack of at least one electrically conductive layer structure and/or at least one electrically insulating layer structure, and at least two vertically stacked electronic components laminated between the base structure and the cover structure.

OVERVIEW OF EMBODIMENTS

In the context of the present application, the term "component carrier" may particularly denote a physical structure which is configured for surface mounting on and/or embedding in, as well as for electrically contacting, at least one electronic component, such as an electronic chip. Thus, after a surface mounting or embedding procedure, the component carrier carries the one or more electronic components on an exterior surface or in an interior thereof.

In the context of the present application, the term "batch" may particularly denote a manufacturing architecture by which multiple component carriers are manufactured at least partially simultaneously so that one or more manufacturing steps (such as laminating) can be carried out for the multiple component carriers together. After such parallel processing or common manufacturing procedures which may be carried out on an integral structure including preforms of the multiple component carriers to be manufactured, separation or singularization of the integral structure into the various component carriers may be carried out.

In the context of the present application, the term "wafer structure" may particularly denote an integral structure comprising multiple electronic components within an integral body. For instance, a wafer structure may be based on a semiconductor plate or disk, and may be made of silicon, silicon carbide, gallium nitride, etc. Semiconductor technology processing may be used for the formation of integrated circuit (IC) elements in the wafer structure. A wafer structure may either be a full wafer (for instance having a circular or rectangular geometry) or may be a part (such as a stripe or a circular segment) of a full wafer including a plurality of electronic components in an integral body.

In the context of the present application, the term "electronic components" may particularly denote a section of the wafer structure providing an electronic functionality when embedded in a component carrier. In particular, an electronic component may be a semiconductor chip.

In the context of the present application, the term "active region" may particularly denote a surface portion of an electronic component or a corresponding wafer structure in which surface portion at least one integrated circuit is formed by semiconductor processing technologies. In one embodiment, only one of the two opposing main surfaces of an electronic component has an active region. In another embodiment, both of the two opposing main surfaces of the electronic component has an active region.

In the context of the present application, the term "laminating" may particularly denote a procedure of connecting a plurality of layer structures—in the context of exemplary embodiments of the invention in combination with a plurality of wafer structures or electronic components—by the application of pressure, if desired or required accompanied by the addition of heat. In particular, such a pressure and/or temperature triggered process of integrally connecting several elements with one another may melt a material component of a layer stack to be laminated (such as resin, for instance in a so-called B-stage) which changes its chemical and/or physical properties (in particular by cross-linking or the like) so that, after subsequent re-solidification of the melted material component, the various elements are fixedly connected to one another and form an integral structure.

In the context of the present application, the term "layer structure" may particularly denote a complete layer (such as a copper sheet), a patterned layer (such as a sheet of resin, like epoxy resin, and fibers, like glass fibers, with through holes therein, wherein optionally also a heat absorption material may be provided) or a plurality of separate structural elements arranged in the same plane (such as a plurality of vertical through connections, in particular vias which may be copper vias, extending through hollow spaces in a patterned layer, for instance in patterned layers of prepreg or FR4).

In the context of the present application, the term "semifinished product" may particularly denote a preform of a not yet readily finished product. For instance, a semifinished product may still require singularization into individual sections and/or another kind of further processing before a usable product, such as a usable component carrier, is obtained.

In the context of the present application, the term "panel" (which may also be denoted as "core") may particularly denote a flat sheet-like structure of one or multiple layer structures with a format being larger than a format of readily finished component carriers. The format of a panel may be selected in the mentioned larger dimension for simplifying production of multiple component carriers simultaneously. For instance, panels with a dimension of 18 inch×24 inch (or 24 inch×21 inch, or any other form typically used in PCB and substrate manufacturing) can be advantageously used in PCB (printed circuit board) technology. Both a subtractive process and an additive process may be implemented in embodiments of the invention.

In the context of the present application, the term "bare die with pads" may particularly denote a naked piece of semiconductor material (in particular with one or more integrated circuit elements formed in an active region in a surface portion of the piece of semiconductor material) with electrically conductive pads providing an external contact of the active region, but not being packaged or provided with a redistribution layer.

According to a first exemplary embodiment of the invention, a plurality of electronic components (such as semiconductor chips) in a wafer compound, i.e. still integrally connected to one another, are mounted on wafer level together with at least one further corresponding wafer structure on a panel (preferably configured in laminate technology) for carrying out a highly parallel multiple wafer batch manufacturing procedure on one panel for multiple wafer structures. Hence, several of such wafer structures can be laminated with a base structure including this panel, wherein the opposing exposed main surfaces of the wafer structures may then be covered by a cover structure. This arrangement may then be connected by lamination. Only after this multiple wafer batch lamination procedure, singularization of the so obtained arrangement into a plurality of component carriers with a respectively embedded electronic component (from one of the wafer structures) packaged in laminate (of the base structure and the cover structure) is carried out. Thus, multiple wafer structures may be processed simultaneously in terms of lamination with a base structure and a cover structure before individual component carriers are singularized. Thus, singularization of sections of laminate material and singularization of the multiple wafer structures may be performed in one common procedure, and thus very efficiently. A gist of such an embodiment is that one or more PCB-related processes (such as lamination of copper sheets, prepreg sheets, etc.) may be carried out simultaneously, while others may be carried out sequentially (such as drilling vias). Placing multiple wafer structures rather than only a single wafer (usually of circular disk shape) on a common panel (usually of rectangular geometry) may significantly increase the degree of covering the surface of the panel. This saves resources in terms of panel material and in terms of manufacturing time. Such a manufacturing architecture may result in a component carrier with an embedded bare die however still having exposed lateral semiconductor surfaces (being the result of cutting an embedded wafer structure into a plurality of electronic components upon singularization).

According to a second exemplary embodiment of the invention, a plurality of separate electronic components, which are configured as bare semiconductor dies having only pads without redistribution layer, is arranged on a common base structure (for instance face up, i.e. with the active chip surfaces directed away from the base structure, although a face down orientation is possible as well). After a subsequent lamination with a cover structure, the obtained arrangement may be again singularized. Also by this procedure, a highly parallel and very efficient batch manufacture can be carried out. Highly advantageously, base structure and/or cover structure (depending on an orientation of the pads) may synergistically form a redistribution layer translating between the small dimensions of the pads relating to the semiconductor world and the larger dimension of external electric contacts of the electronic components relating to the PCB world or the like (in particular being solder connected to a PCB). When mounting multiple electronic components (such as semiconductor chips) "face up", i.e. with their active surfaces oriented upwardly and hence facing away from the bottom structure, it is highly preferred that the electronic components extend vertically up to the same height for simplifying a subsequent electric connection (such as formation of a common redistribution layer). The latter requirement can be properly met when laminate-packaging the electronic chips in the described way. The mentioned manufacturing architecture is also compatible with the formation of three-dimensionally stacked electronic components (see for instance FIG. 47).

In the following, further exemplary embodiments of the methods, the semifinished products and the component carrier will be explained.

Preferably, the manufacturing methods package the electronic components (either on wafer level, or wafer section level, or on chip level) exclusively with laminate material (in particular only using PCB technology related materials, such as copper, resin and fibers), i.e. without molding (in particular without overmolding). This reduces the thermal mismatch from which component carriers made of materials with strongly differing values of the coefficient of thermal expansion (CTE) may conventionally suffer. Hence, the manufactured component carriers may be less prone to failure under thermal load.

In an embodiment, the method further comprises, before the laminating, arranging the plurality of wafer structures on a common panel comprising at least one of the at least one electrically conductive layer structure and the at least one electrically insulating layer structure, and arranging at least one other of the at least one electrically conductive layer structure and the at least one electrically insulating layer structure on top of the plurality of wafer structures on the common panel (see for instance FIG. 1 to FIG. 6). In such an embodiment, all wafer structures may be arranged within a common plane. In other words, all wafer structures may be arranged on the same bottom side panel or panel portion. According to the described architecture, a laminate type base structure of electrically conductive layer structures and/or electrically insulating layer structures may be arranged below the wafer structures which are therefore sandwiched on both opposing main surfaces with component carrier material (for instance copper and prepreg for the example of a PCB).

In an embodiment, each of the plurality of separate wafer structures may be accommodated within an accommodation compartment delimited by a frame structure of the base structure (and/or of the cover structure). More specifically, at least part of the accommodation compartments may be partially filled with release material (such as Teflon or a non-adhesive wax) surrounding the respective wafer structure. This simplifies removal of the two-sided laminated wafer structure from the compartment, since the release material can be specifically selected so as to be easily separable from the laminated wafer structure. This prevents damage of the wafer structure during the handling process.

In another embodiment, the method further comprises, before the laminating, arranging at least one of the wafer structures and at least one of the at least one electrically conductive layer structure and the at least one electrically insulating layer structure on a first main surface of a sacrificial core, and arranging at least one other of the wafer structures and at least one other of the at least one electrically conductive layer structure and the at least one electrically insulating layer structure on an opposing second main surface of the sacrificial core (see for instance FIG. 7 to FIG. 12). Correspondingly, the semifinished product may further comprise a sacrificial core having a first main surface and an opposing second main surface, wherein a first part of the base structure covers the first main surface, a second part of the base structure covers the second main surface, at least one of the wafer structures is arranged on the first part of the base structure, at least another one of the wafer structures is arranged on the second part of the base structure, a first part of the cover structure covers the at least one of the wafer structures and part of the first part of the base structure, and a second part of the cover structure covers the at least one other of the wafer structures and part of the second part of the base structure. In such an embodiment, two sets of wafer structures may be arranged within two vertically displaced parallel planes. In other words, the two sets of wafer structures may be arranged on opposing sides of the sacrificial core. According to such an embodiment, both opposing main surfaces of the sacrificial core are covered with one or, even more preferably, a plurality of wafer structures so that an efficient batch processing is possible using both main surfaces of the sacrificial core as a support for a multiple component carrier preform. This further improves the efficiency of the manufacture. Moreover, such an architecture makes it possible to obtain asymmetrically configured component carriers. The reason for this is that a symmetrical lamination architecture is sufficient on both opposing main surfaces of the sacrificial core, but not with regard to the sub-structures on one respective main surface of the sacrificial core. This further increases the freedom of designing component carriers. The concept of using the mentioned sacrificial core allows to highly efficiently manufacture coreless component carriers, if desired with asymmetrical properties in stacking direction, each with one or more embedded electronic components.

In an embodiment, the sacrificial core is composed of a central stabilizing layer (or layer stack) covered on its first main surface, by a first release layer, and covered on its second main surface, by a second release layer. The release layers may be made of a material at which a delamination of the structure above and below the sacrificial core is enabled, for instance by peeling these arrangements simply off the sacrificial core. The central layer or layer stack provides mechanical support for the batches of component carrier preforms stacked on both opposing sides of the sacrificial core.

In an embodiment, at least part of the wafer structures is a full wafer, in particular of full circular wafer. Such a full wafer may be a circular disc of semiconductor material having integrated therein integrated circuit elements. Metallization layers may be applied on such a semiconductor wafer. Diameters of such wafers may be, for instance, 5.9 inch (corresponding to 150 mm), 7.9 inch (corresponding to 200 mm), 11.8 inch (corresponding to 300 mm), etc.

Additionally or alternatively, at least part of the wafer structures is a partial wafer, in particular a stripe shaped partial wafer (wherein the stripe may be delimited by two parallel long sides and two shorter sides with circular curvature). Also a wafer structure shaped as a circular segment (i.e. a region of a circle which is cut off from the rest of the circle by a secant or a chord) or as a circular sector (i.e. a portion of a disk enclosed by two radii and an arc) can be used in exemplary embodiments as partial wafer constituting a wafer structure. Placement of multiple partial (in particular semiconductor) wafers on a common (in particular PCB) panel may be a highly advantageous embodiment, since the arrangement of such partial wafers may allow a further improved ratio, more precisely a higher ratio, between an occupied surface of the base structure and an entire surface of the base structure. The amount of material of the base structure which is lost or remains unused can therefore be reduced.

In an embodiment, the at least one electrically conductive layer structure and the at least one electrically insulating layer structure constitute a panel with a dimension of 24 inch×18 inch (corresponding to 610 mm×457 mm) or 24 inch×21 inch, or any other form typically used in PCB and substrate manufacturing. This is an appropriate working format in PCB technology.

Preferably, exactly six full semiconductor wafers (for instance with a diameter of 7.9 inch, corresponding to 200 mm) may be arranged on the panel (for instance with a dimension of 24 inch×18 inch, corresponding to 610 mm×457 mm, or 24 inch×21 inch, or any other form typically used in PCB and substrate manufacturing). Such an architecture is compatible with standard panel sizes of printed circuit board technology. Efficient batch processing on panel level is therefore enabled.

In an embodiment, the wafer structures are arranged on top of at least one bottom side part of the at least one electrically conductive layer structure and the at least one electrically insulating layer structure so that a still exposed active region of the wafer structures may arranged opposing the bottom side part. In other words, the wafer structures may be arranged on the at least one electrically conductive layer structure and the at least one electrically insulating layer structure so that, prior to the laminating, an active region of the wafer structures opposes another surface of the wafer structures contacting the at least one electrically conductive layer structure and the at least one electrically insulating layer structure. Consequently, the wafers or wafer structures may be arranged with the active chip surfaces face up on the base structure, i.e. with the active region of the wafer structures facing upwardly and hence away from the base structure. It is however alternatively also possible that the wafer structures are arranged face down, i.e. with the active region facing towards the base structure. In still other embodiments, for instance when the electronic components are configured as power semiconductor chips, they may also have two opposing main surfaces which both have active regions and which are therefore both contacted.

In an embodiment, the method further comprises forming, in particular prior to the singularizing, a plurality of through connections extending through the at least one electrically insulating layer structure for electrically contacting at least one of the group consisting of the electronic components and the at least one electrically conductive layer structure. Such through-connections may be vias, i.e. (for instance laser drilled or mechanically drilled) through-holes filled with (for instance plated) electrically conductive (for instance copper) material. Additionally or alternatively to the formation of one or more through connections, it is also possible to form one or more blind vias, in particular for contacting an electronic component such as a semiconductor chip.

In an embodiment, an active region of the electronic components op-poses another surface of the electronic components contacting the common panel. Thus, the bare dies may be located face-up, i.e. with the active region oriented upwardly. Alternatively, an active region of the electronic components faces the common panel. Thus, the bare dies may be located face-down, i.e. with the active region oriented downwardly. However, it is also possible that the bare dies have pads on both opposing main surfaces so that the pads are oriented both upwardly and downwardly.

In an embodiment, the bare dies are spaced from one another by a respective horizontal gap on the common panel so that the redistribution layer spatially extends into the gaps and thereby spatially increases dimension and spacing of external electric contacts of the redistribution layer as compared to dimension and spacing between the pads of the bare dies. Therefore, a fan-out architecture may be implemented allowing the small dimensions of the pads (in terms of their own extension and in terms of the distance between adjacent pads) to be transformed into larger dimensions of the electric contacts (in terms of their own extension and in terms of the distance between adjacent electric contacts) at an exterior surface of the manufactured electronic component. The latter electric contacts are then to be connected to a printed circuit board or the like for instance by soldering which is then conveniently possible on a larger scale in terms of dimension.

In an embodiment, the component carriers are shaped as a plate. Such a plate may be formed by laminating.

In an embodiment, the component carriers are configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the electronic components are selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. Preferably, the electronic component is a semiconductor chip.

In an embodiment, the semifinished product further comprises a sacrificial core having a first main surface and an opposing second main surface, wherein a first part of the base structure covers the first main surface, a second part of the base structure covers the second main surface, at least two of the electronic components are arranged on the first part of the base structure, at least another two of the electronic components are arranged on the second part of the base structure, a first part of the cover structure covers the at least two of the electronic components and part of the first part of the base structure, and a second part of the cover structure covers the at least two other of the electronic components and part of the second part of the base structure. Hence, the above described concept of a sacrificial core may also be applied to the above described embodiment of multiple already separated electronic chips being mounted on the base structure.

In an embodiment, the semifinished product further comprises at least one further plurality of separate electronic components (in particular configured as bare dies with pads) on the cover structure, and a further cover structure comprising at least one further electrically conductive layer structure and/or at least one further electrically insulating layer structure and being arranged to cover the further electronic components and part of the cover structure. More specifically, at least two of the further electronic components may be arranged on a first part of the cover structure, at least two other of the further electronic components may be arranged on a second part of the cover structure, a first part of the further cover structure covers the at least two of the further electronic components and part of the first part of the cover structure, and a second part of the further cover structure covers the at least two other of the further electronic components and part of the second part of the cover structure. Thus, the concept of a sacrificial core with a buildup on both opposing main surfaces thereof may be also used for forming a three-dimensional vertical stack of electronic components.

In an embodiment, the at least one electrically insulating layer structure comprises at least one of the group consisting of resin (such as reinforced or non-reinforced resins, for instance epoxy resin), in particular Bismaleimide-Triazine resin, cyanate ester, glass (in particular glass fibers, multilayer glass or glass-like materials), prepreg material, polyimide, polyamide, liquid crystal polymer, epoxy-based Build-Up Film, FR4 material, FR5 material, polytetrafluoroethylene (Teflon), a ceramic, and a metal oxide. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In certain embodiments, in particular the electrically insulating and/or electrically conductive layer structures may be adapted to fulfill specific technical functions. For example, they may be provided with a shaping surface, for example for balancing out heights differences between elements arranged juxtaposed to one another. It is also possible that these or other constituents are adjusted in terms of their thermal conductivity (for instance by filling them with thermally conductive particles). Moreover, these or other constituents may be provided with magnetic properties and/or with magnetic field shielding properties and/or with electromagnetic field shielding properties, if desired. These and other constituents may be further adapted for high frequency applications. Optoelectronic components (such as light fibers) may be embedded, for example to promote light transmission through the component carrier.

In an embodiment, the lateral semiconductor surface of the component carrier is at least partially covered by protective material. Such protective material can be, for example a laminate or a mold compound in which at least part of the component carrier may be embedded. It is however also possible that the protective material is embodied as a cover layer applied on the lateral semiconductor surface. Such a protective material increases the robustness of the component carrier.

In an embodiment, the lateral semiconductor surface forms part of an exterior surface of the component carrier and is exposed to an environment. For certain applications, it may be sufficient to keep the naked semiconductor surfaces uncovered. This results in a compact component carrier which can be manufactured with low effort.

In an embodiment, at least one of the base laminate (which may form part of the above-mentioned base structure of the semifinished product) and the cover laminate (which may form part of the above-mentioned cover structure of the semifinished product) forms at least part of a redistribution layer which spatially increases dimension and spacing of external electric contacts of the redistribution layer as compared to dimension and spacing between the pads of the bare die. Therefore, a compact component carrier may be manufactured which nevertheless has the proper provisions for being mountable on a carrier such as a PCB.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 1, FIG. 2, FIG. 3, FIG. 4, FIG. 5 and FIG. 6 show cross-sectional views of structures obtained during carrying out a method of manufacturing a batch of component carriers (compare FIG. 6) according to an exemplary embodiment of the invention, wherein FIG. 4 and FIG. 5 show semifinished products according to exemplary embodiments of the invention.

FIG. 7, FIG. 8, FIG. 9, FIG. 10, FIG. 11 and to FIG. 12 show cross-sectional views of structures obtained during carrying out a method of manufacturing a batch of component carriers (compare FIG. 12) according to another exemplary embodiment of the invention, wherein FIG. 10 and FIG. 11 show semifinished products according to exemplary embodiments of the invention.

FIG. 13, FIG. 14, FIG. 15, FIG. 16, FIG. 17 and FIG. 18 show cross-sectional views of structures obtained during carrying out a method of manufacturing a batch of component carriers (see FIG. 18) according to an exemplary embodiment of the invention, wherein FIG. 16 and FIG. 17 show semifinished products according to exemplary embodiments of the invention.

FIG. 19, FIG. 20, FIG. 21, FIG. 22, FIG. 23 and FIG. 24 show cross-sectional views of structures obtained during carrying out a method of manufacturing a batch of component carriers (see FIG. 24) according to another exemplary embodiment of the invention, wherein FIG. 22 and FIG. 23 show semifinished products according to exemplary embodiments of the invention.

DETAILED DESCRIPTION OF ILLUSTRATED EMBODIMENTS

Figure 1:
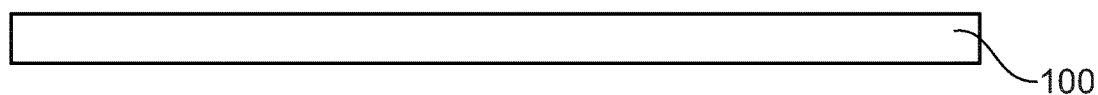

The illustrations in the drawings are schematically presented.

Figure 2:
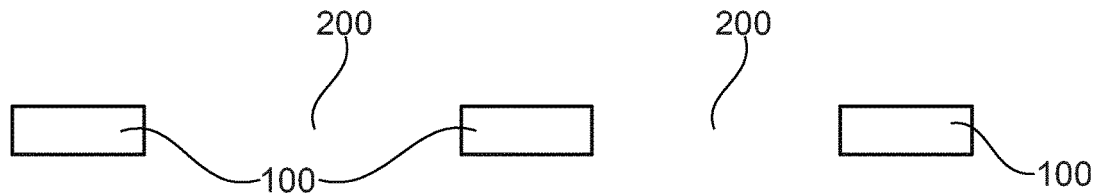
Figure 3:
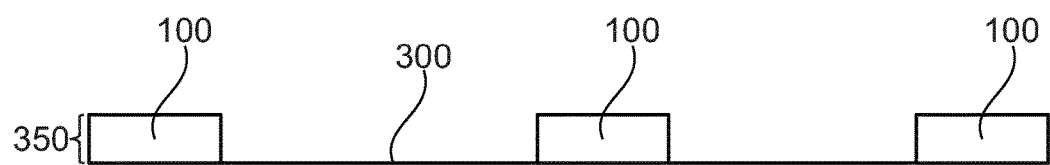
Figure 4:
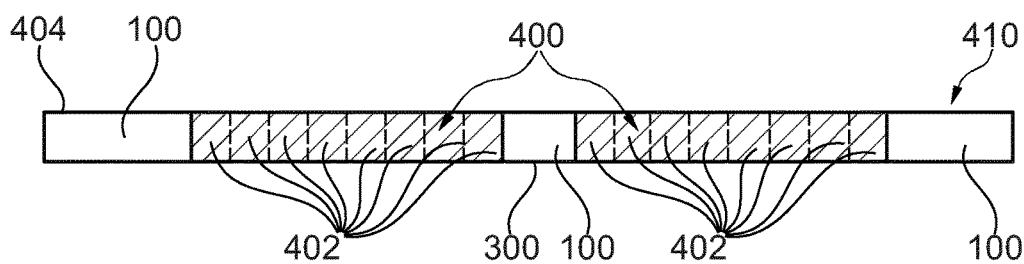
Figure 5:
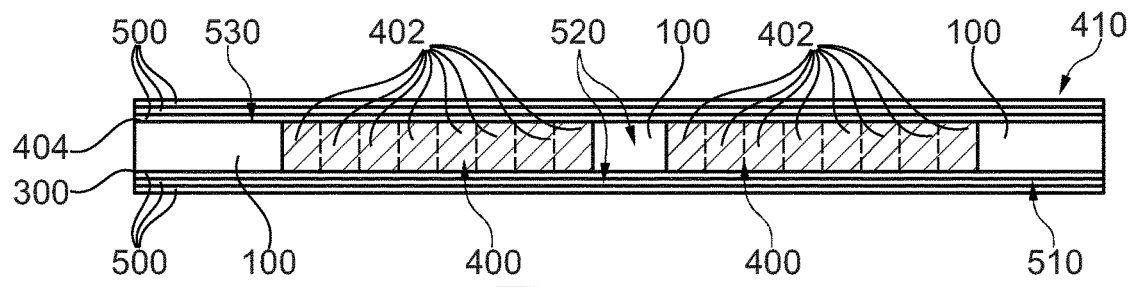

FIG. 1 to FIG. 6 show cross-sectional views of structures obtained during carrying out a method of manufacturing a batch of component carriers 600 (compare FIG. 6) according to an exemplary embodiment of the invention, wherein FIG. 4 and FIG. 5 show semifinished products 410 according to exemplary embodiments of the invention.

In order to obtain a structure shown in FIG. 1, a dummy core 100 is provided. The dummy core 100 can be made of one or more layers of electrically insulating material such as resin or resin filled with glass fibres, in particular FR4.

In order to obtain a structure shown in FIG. 2, the dummy core 100 is cut or patterned so as to form recesses 200 at positions in which later wafer structures 400 are to be inserted (see FIG. 4).

In order to obtain the structure shown in FIG. 3, an RCC foil 300 (resin coated copper) is connected to the recessed dummy core 100 to function in the following as common support structure 350. This connection can be performed by application of pressure and heat, or by gluing. A resin coated copper (RCC) foil is a copper foil coated with resin material, for instance epoxy resin, and therefore comprises an electrically conductive copper layer and two electrically insulating resin layers thereon. The support structure 350, composed of electrically conductive and electrically insulating layer structures, may be provided in a PCB production format with a dimension of for example 24 inch×18 inch (or 24 inch×21 inch, or any other form typically used in PCB and substrate manufacturing).

In order to obtain semifinished product 410 shown in FIG. 4, two (or more) separate wafer structures 400 (such as readily processed semiconductor wafers, or sections thereof which still include a plurality of integrally connected semiconductor chips, in particular naked dies) are inserted into the corresponding recesses 200 of the dummy core 100. As can be taken from FIG. 4, each of the wafer structures 400 comprises a plurality of still integrally connected electronic components 402 which are to be singularized later to form for instance individual semiconductor chips. Furthermore, a further RCC foil 404 (resin coated copper, see above description) is attached to an upper surface of the shown structure. The bodies with reference numerals 350, 400, 404 may be connected to one another, for instance by laminating, gluing, etc. Hence, the further RCC foil 404 may be connected with this remaining structure by applying heat and pressure, or by gluing. The wafer structures 400 may be arranged on the common support structure 350 face up, i.e. with their active regions (i.e. their main surface regions in which the integrated circuit elements have been formed by semiconductor processing) being oriented upwardly away from the common panel 350 and towards the further RCC foil 404. Alternatively, the active regions may also be arranged face down. Further alternatively, wafer structures 400 with active regions on both opposing main surfaces may be embedded, for instance for power applications.

Next, it will be described how semifinished product 410 shown in FIG. 5 can be obtained.

Both a top surface and a bottom surface of the semifinished product 410 shown in FIG. 4 may be subsequently covered by one or more further electrically conductive and/or electrically insulating layer structures 500 (such as copper sheets, prepreg sheets, etc.), which are preferably laminable. Thus, the plurality of wafer structures 400 on the common support structure 350 and covered by the further RCC foil 404 may be additionally covered by the further electrically conductive and/or electrically insulating layer structures 500 before subsequent connection of all these elements to one another by lamination. In order to obtain the semifinished product 410 shown in FIG. 5, the plurality of electrically conductive layer structures and/or electrically insulating layer structures 500 are arranged, preferably symmetrically, on both opposing main surfaces of the semifinished product 410 shown in FIG. 4. For instance, the electrically conductive layer structures may be made of copper (for instance may be copper foils), whereas the electrically insulating layer structures may be made of prepreg (such as a resin matrix with glass fibres embedded therein). Subsequently, the components of the structure shown in FIG. 5 can be connected to one another by a lamination, i.e. the application of pressure and heat. This procedure may be repeated once or several times. Furthermore, layers may be patterned, vias may be formed, and/or at least one additional PCB procedure may be carried out.

The semifinished product 410 according to an exemplary embodiment as shown in FIG. 5 hence comprises a laminate of a bottom side located base structure 520 (see reference numerals 350, 500) of electrically conductive and electrically insulating layer structures. The semifinished product 410 furthermore comprises the plurality of embedded separate and complete wafer structures 400, each composed of a plurality of identical and still integrally interconnected electronic components 402, and arranged on the base structure 520. Moreover, the semifinished product 410 comprises a top side oriented cover structure 530 (see reference numerals 404, 500) of electrically conductive and electrically insulating layer structures covering the wafer structures 400 and part of the base structure 520 to thereby form a plate shaped panel-sized preform which only needs to be singularized for obtaining multiple component carriers 600.

Figure 6:
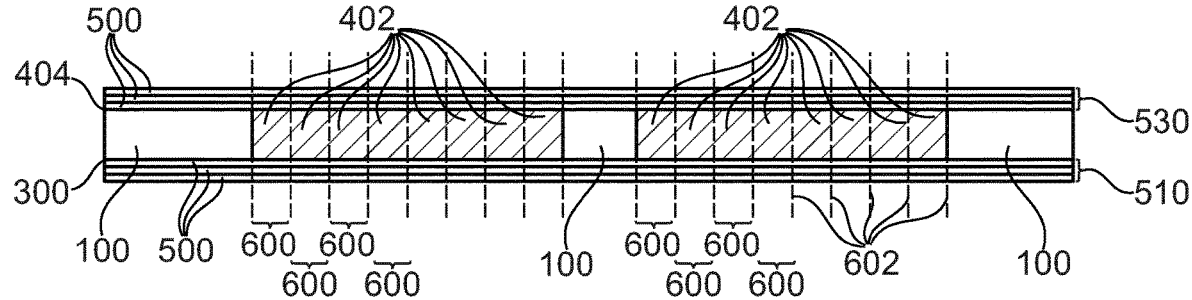

In order to obtain the individual component carriers 600 shown in FIG. 6, the semifinished product 410 according to FIG. 5 is singularized, for instance by cutting, etching or sawing. Thus, the individual sections obtained by separating the panel with embedded wafers according to FIG. 5 at singularization lines 602 may be used and treated as individual component carriers 600, for instance as PCB, interposer, or substrate. Regions with the dummy core 100, in which no electronic components 402 are present, may then be disposed, reused or recycled. Hence, a structure resulting from the laminating according to FIG. 5 may be singularized into the plurality of component carriers 600, each comprising for instance one of the electronic components 402, a part of the base structure 520 and a part of the cover structure 530. The latter two parts (see reference numerals 520, 530) form a laminate-type encapsulant of the respective one or more electronic components 402. FIG. 1 to FIG. 6 therefore shows that the batch manufacturing of the component carriers 600 with the embedded electronic components 402 is very efficient and results in only a very small amount of material which remains unused.

Figure 8:
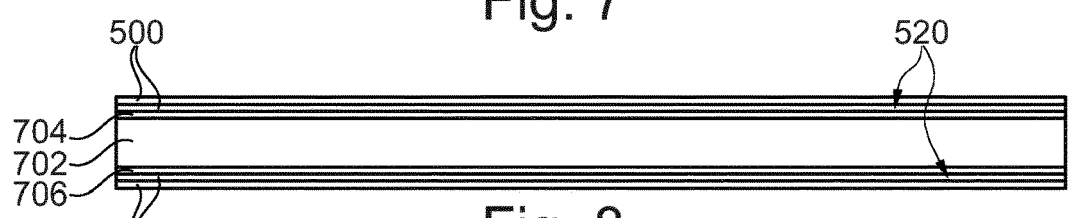
Figure 9:
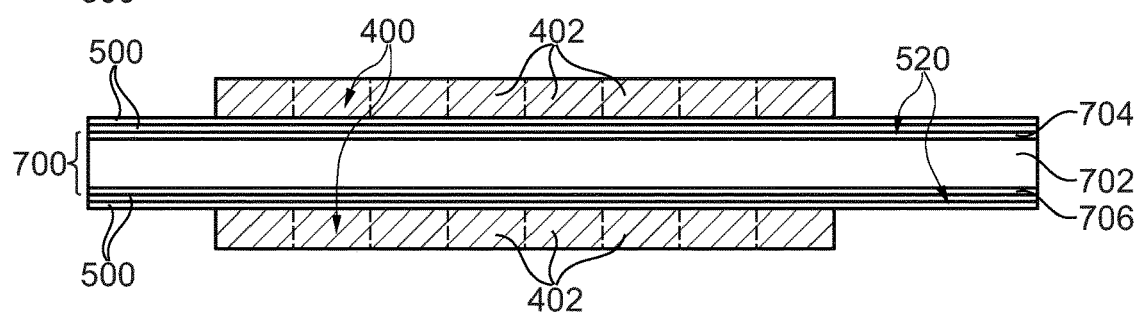
Figure 10:
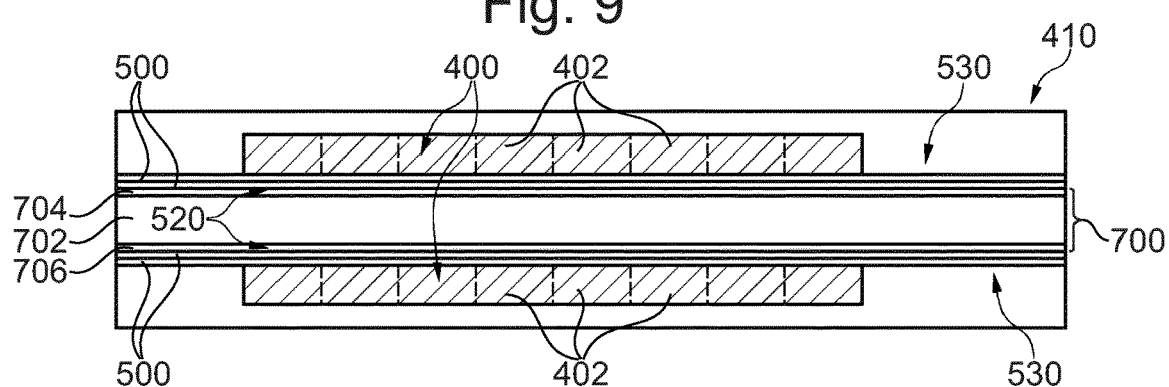
Figure 11:
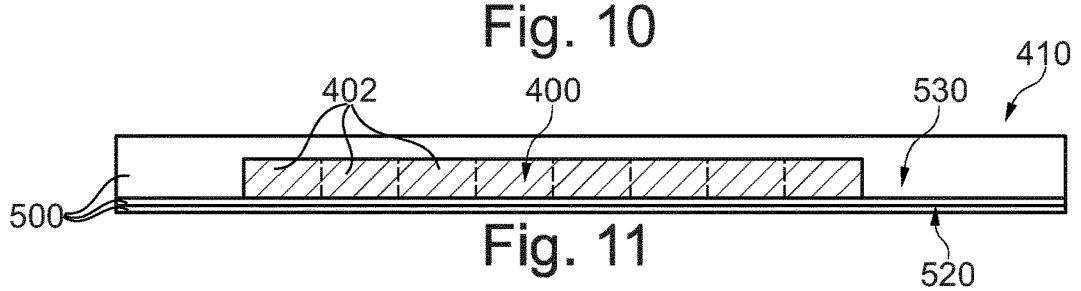

FIG. 7 to FIG. 12 show cross-sectional views of structures obtained during carrying out a method of manufacturing a batch of component carriers 600 (compare FIG. 12) according to another exemplary embodiment of the invention, wherein FIG. 10 and FIG. 11 show semifinished products 410 according to exemplary embodiments of the invention.

Figure 7:
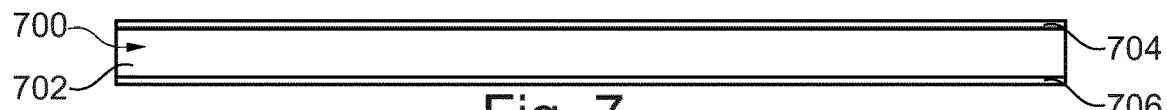

In order to obtain the structure as shown in FIG. 7, two release layers 704, 706 are arranged on two opposing main surfaces of a core layer 702 of a sacrificial core 700, shaped as a plate. Hence, the sacrificial core 700 is composed of central stabilizing core layer 702 (or layer stack) which is covered on its first main surface by the first release layer 704 and which is covered on its second main surface by the second release layer 706.

In order to obtain the structure shown in FIG. 8, electrically conductive and/or electrically insulating layer structures 500 are arranged on both opposing main surfaces of the sacrificial core 700 shown in FIG. 7. The components of the structure shown in FIG. 8 may then be connected to one another by lamination, i.e. the application of pressure and heat. The electrically conductive and/or electrically insulating layer structures 500 formed on each of the main surfaces of the sacrificial core 700 may function as two separate portions of a base structure 520, since they form the base for layer sequences formed on the two opposing main surfaces of the sacrificial core 700 according to the following manufacturing procedure.

In order to obtain the structure shown in FIG. 9, a respective wafer structure 400 is arranged on each opposing main surface of the structure shown in FIG. 8. Although only one wafer structure 400 is shown on each of the main surfaces according to FIG. 9, it is also possible to arrange a plurality of wafer structures 400 on any of the two opposing main surfaces. Hence, the method further comprises, before subsequently described laminating, arranging one or more wafer structures 400 and the electrically conductive and/or electrically insulating layer structures 500 on the first main surface of the sacrificial core 700. Moreover, one or more other wafer structures 400 and electrically conductive and/or electrically insulating layer structures 500 may be arranged on the opposing second main surface of the sacrificial core 700.

In order to obtain the structure shown in FIG. 10, additional electrically insulating and/or electrically conductive layer structures 500 are arranged on both opposing main surfaces of the structure shown in FIG. 9 so as to cover the entire wafer structures 400 as well as exposed surface regions of the portions of the base structure 520. One or more of the electrically insulating and/or electrically conductive layer structures 500 on the top side may be provided with one or more recesses shaped and dimensioned for accommodating the respective one or more wafer structures 400. In particular, number and thickness of the one or more recessed electrically insulating and/or electrically conductive layer structures 500 may be selected so that these recessed electrically insulating and/or electrically conductive layer structures 500 flush without step with the upper surface of the accommodated wafer structures 400. When the height level of these bodies 500, 400 are adapted to one another, subsequent lamination is simplified and undesired delamination can be suppressed. This additional electrically insulating and/or electrically conductive material forms two separate portions of cover structure 530, each of these portions covering a respective main surface of the structure shown in FIG. 9. The structural elements shown in FIG. 10 may then be connected to one another by lamination to thereby form semifinished product 410.

Hence, the obtained semifinished product 410 according to FIG. 10 comprises a first part of the base structure 520 covering the first main surface of the sacrificial core 700, a second part of the base structure 520 covering the second main surface of the second core 700, the above-mentioned wafer structure 400 being arranged on the first part of the base structure 520, the other above-mentioned wafer structure 400 arranged on the second part of the base structure 520, a first part of the cover structure 530 covering the upper wafer structure 400 and part of the first part of the base structure 520, and a second part of the cover structure 530 covering the other wafer structure 400 and part of the second part of the base structure 520.

Subsequently, the structures on the two opposing main surfaces of the sacrificial core 700 may be delaminated or peeled off at the release layers 704, 706 so as to obtain the two semifinished products 410, one of which being shown in FIG. 11. Advantageously, the arrangement of FIG. 11 needs not to be symmetrically with regard to a center of the laminated layer stack in the vertical direction thanks to the manufacture using the sacrificial core 700. This provides a designer with a high flexibility of manufacturing electronic components 600 with substantially any desired composition.

Figure 12:
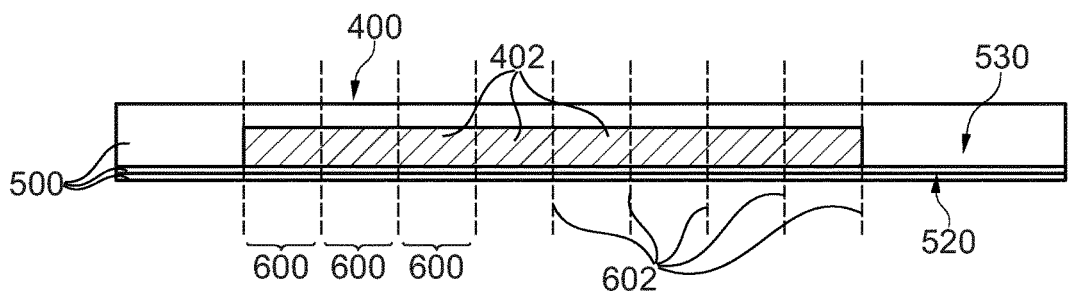

In order to obtain the component carriers 600 shown in FIG. 12, the semifinished product 410 shown in FIG. 11 is singularized along singularization lines 602 by sawing, laser cutting, mechanical cutting, etching, or the like. Exposed side surfaces of the electronic chips 402 may remain uncovered in the final product, or may be coated or covered with protective material (not shown).

As can be taken from the method described referring to FIG. 7 to FIG. 12, a highly efficient batch manufacture architecture is provided for forming a plurality of component carriers 600 with embedded electronic components 402 according to an exemplary embodiment of the invention.

Figure 14:
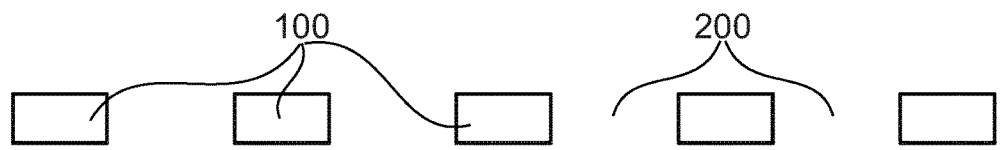
Figure 15:
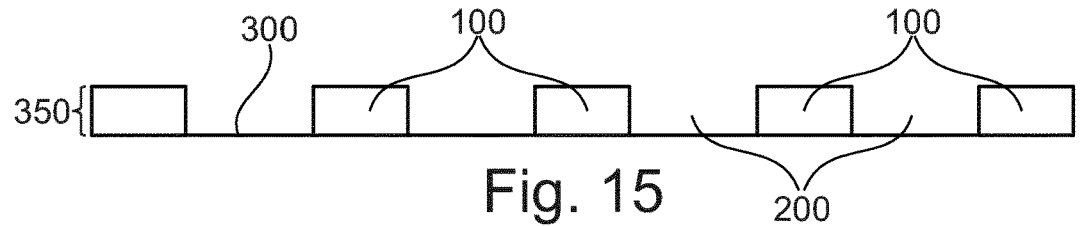
Figure 16:
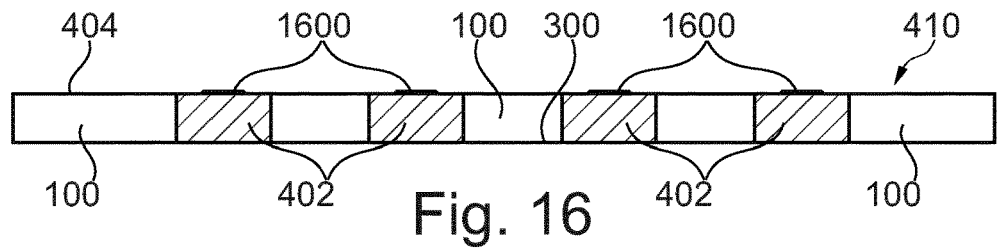
Figure 17:
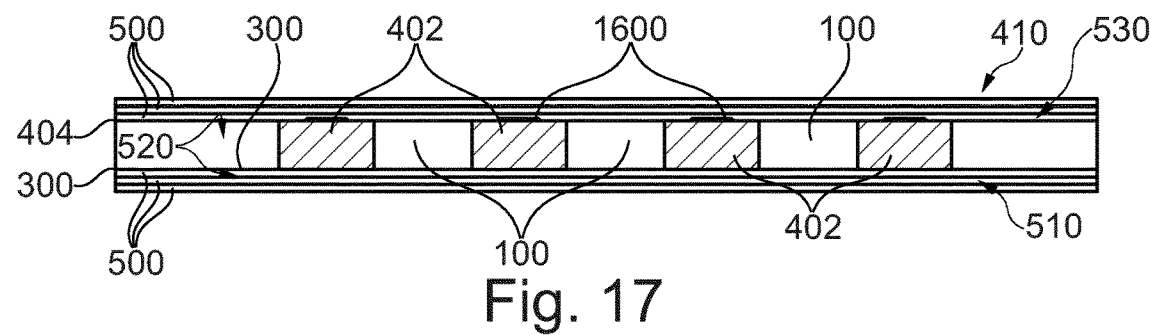

FIG. 13 to FIG. 18 show cross-sectional views of structures obtained during carrying out a method of manufacturing a batch of component carriers 600 (see FIG. 18) according to an exemplary embodiment of the invention, wherein FIG. 16 and FIG. 17 show semifinished products 410 according to exemplary embodiments of the invention.

Figure 13:
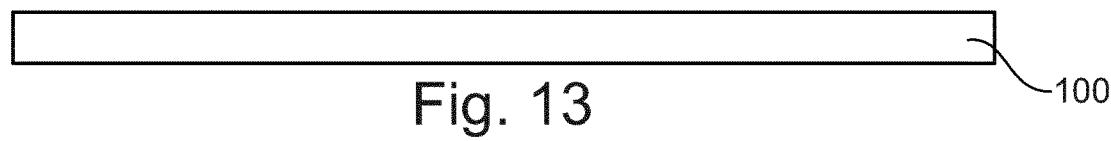

The structures shown in FIG. 13, FIG. 14 and FIG. 15 substantially correspond to the structures shown in FIG. 1 to FIG. 3, respectively.

In order to obtain the semifinished product 410 shown in FIG. 16, individual singularized electronic components 402, in the shown embodiment already singularized naked dies or bare dies with pads only but without redistribution layer or the like, are placed in the various recesses 200 of the dummy core 100. As can be taken from FIG. 16, the electronic components 402 are placed in these recesses 200 so that active regions 1600 of the electronic components 402 embodied as semiconductor chips are oriented upwardly. In this active region 1600, integrated circuit elements have been monolithically integrated by semiconductor technology beforehand. Such integrated circuit elements in the semiconductor body of the electronic components 402 may be electrically contacted to the connected PCB material via chip pads on top of the active regions 1600.

In order to obtain the semifinished product 410 shown in FIG. 17, one or more electrically insulating layer structures and/or electrically conductive layer structures 500 are arranged on both opposing main surfaces of the semifinished product 410 shown in FIG. 16. Subsequently, all elements shown in FIG. 17 may be connected to one another by lamination, i.e. the application of pressure and heat. During this procedure, a redistribution layer is formed on the bare dies (compare for example FIG. 44). This formation of a redistribution layer is promoted or simplified by the fact that the bare dies are spaced from one another horizontally by a respective gap on the common panel 510 (see FIG. 17) so that the redistribution layer spatially extends into the gaps and thereby spatially increases dimension and spacing of external electric contacts of the redistribution layer as compared to dimension and spacing between the pads of the bare dies.

The semifinished product 410 according to FIG. 17 is hence a laminate of a base structure 520 composed of common panel 510 comprising the electrically conductive and electrically insulating layer structures (see reference numerals 300, 500) and composed of the remaining sections of the dummy core 100. The separate electronic components 402 are arranged on the common panel 510, wherein the active region 1600 at the upper surface of the electronic components 402 opposes the lower surface of the electronic components 402 contacting the common panel 510 of the base structure 520, i.e. are oriented face up. The cover structure 530 comprises further electrically conductive and/or electrically insulating layer structures (see reference numerals 404, 500) which are arranged to cover the active region 1600 of the electronic components 402 and part of the base structure 530.

Figure 18:
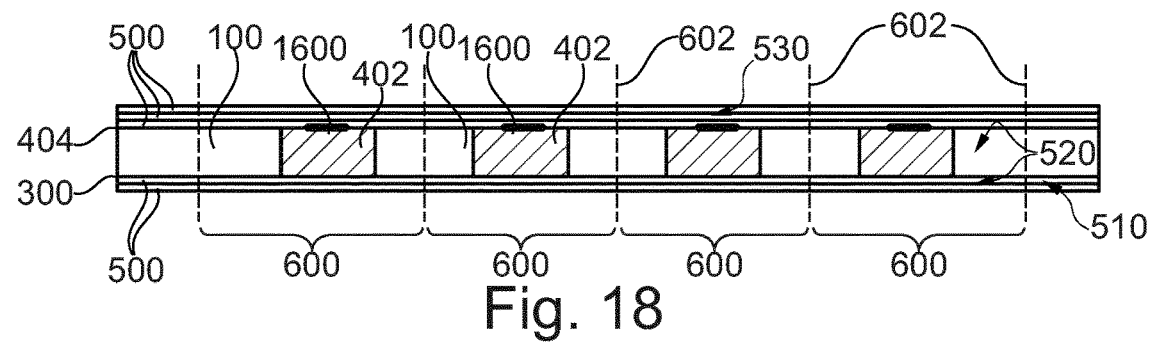

In order to obtain the component carriers 600 shown in FIG. 18, the semifinished product 410 according to FIG. 17 is singularized at singularization lines 602, for instance by sawing, cutting or etching. Consequently, a plurality of individual component carriers 600 are obtained with embedded electronic components 402. Each of the component carriers 600 comprises a part of the base structure 520, one of the electronic components 402, and a part of the cover structure 530.

Figure 20:
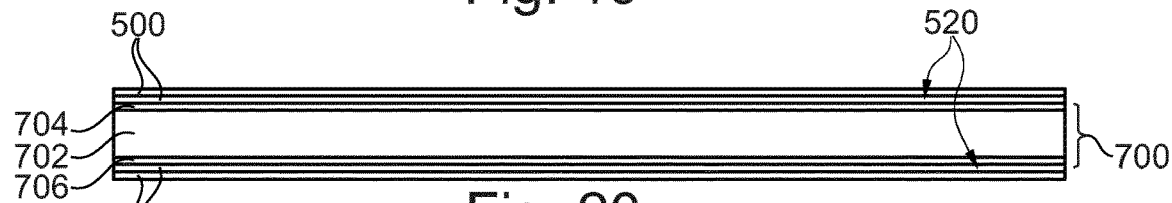
Figure 21:
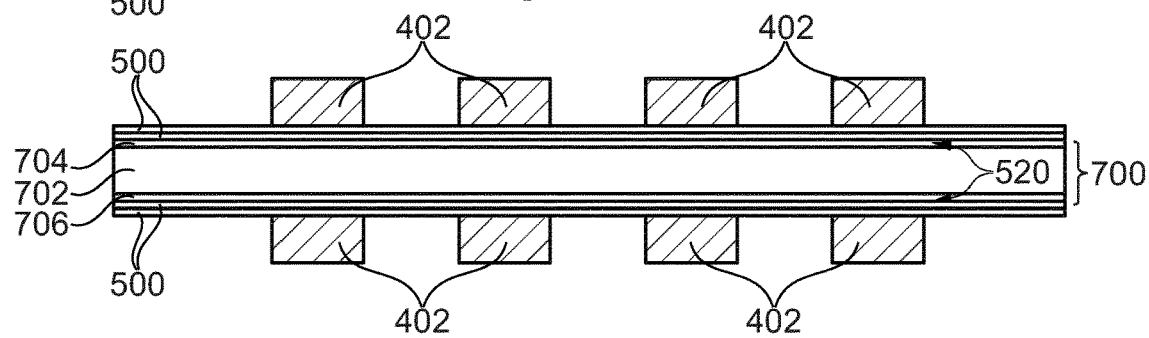
Figure 22:
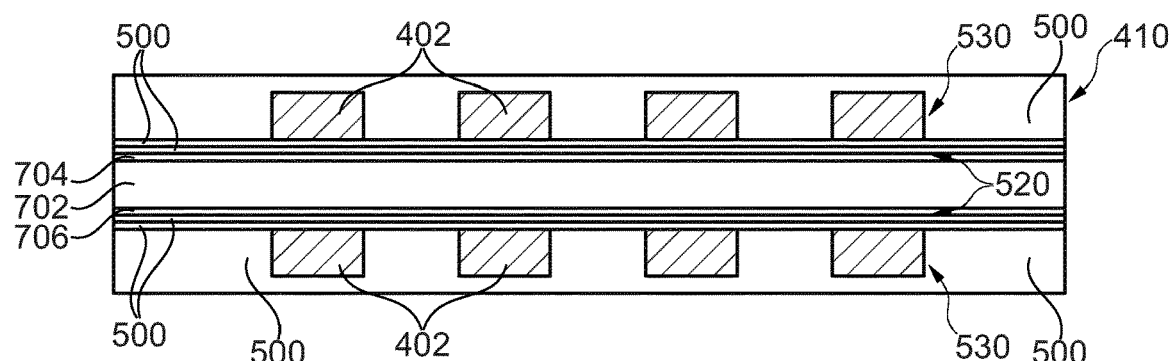
Figure 23:
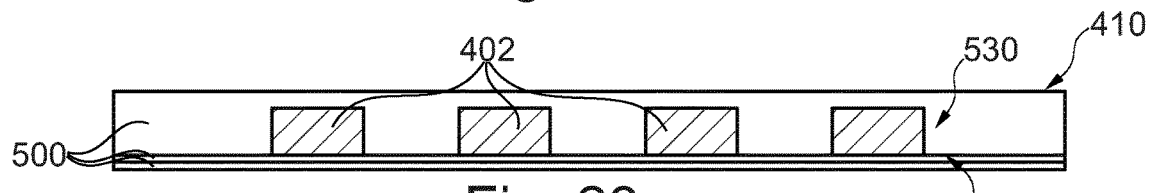

FIG. 19 to FIG. 24 show cross-sectional views of structures obtained during carrying out a method of manufacturing a batch of component carriers 600 (see FIG. 24) according to another exemplary embodiment of the invention, wherein FIG. 22 and FIG. 23 show semifinished products 410 according to exemplary embodiments of the invention.

Figure 19:
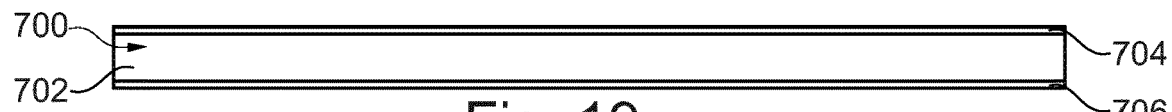

FIG. 19 and FIG. 20 substantially correspond to FIG. 7 and FIG. 8, as described above. A first portion and a second portion of a base structure 520 are attached to the two opposing main surfaces of the sacrificial core 700 according to FIG. 19.

In order to obtain the structure shown in FIG. 21, the already singularized or individual component carriers 402 (in the shown embodiment separate semiconductor chips) are arranged (for instance attached, for example by glue) on both opposing main surfaces of the sacrificial core 700 covered on both main surfaces thereof with the laminated electrically conductive layer structures and electrically insulating layer structures 500.

In order to obtain the semifinished product 410 shown in FIG. 22, further electrically insulating layer structures 500 and/or electrically conductive layer structures are arranged on both opposing main surfaces of the structure shown in FIG. 21 and may be connected therewith by lamination, i.e. by the application of heat and pressure. This additionally applied material forms a first portion and a second portion, respectively of cover structure 530. One or more of the electrically insulating and/or electrically conductive layer structures 500 on the top side may be provided with one or more recesses shaped and dimensioned for accommodating the respective electronic components 402. In particular, number and thickness of the one or more recessed electrically insulating and/or electrically conductive layer structures 500 may be selected so that these recessed electrically insulating and/or electrically conductive layer structures 500 flush without step with the upper surfaces of the accommodated electronic components 402. When the height level of these bodies 500, 402 are adapted to one another, subsequent lamination is simplified and undesired delamination can be suppressed.

The semifinished product 410 shown in FIG. 22 comprises the sacrificial core 700, wherein a first part of the base structure 520 covers a first main surface of the sacrificial core 700. A second part of the base structure 520 covers the opposing second main surface of the sacrificial core 700. Multiple electronic components 402 are arranged on the first part of the base structure 520. Correspondingly, multiple further electronic components 402 are arranged on the second part of the base structure 520. Furthermore, a first part of the cover structure 530 covers the electronic components 402 and part of the first part of the base structure 520. Accordingly, a second part of the cover structure 530 covers the other electronic components 402 and part of the second part of the base structure 520.

Figure 47:
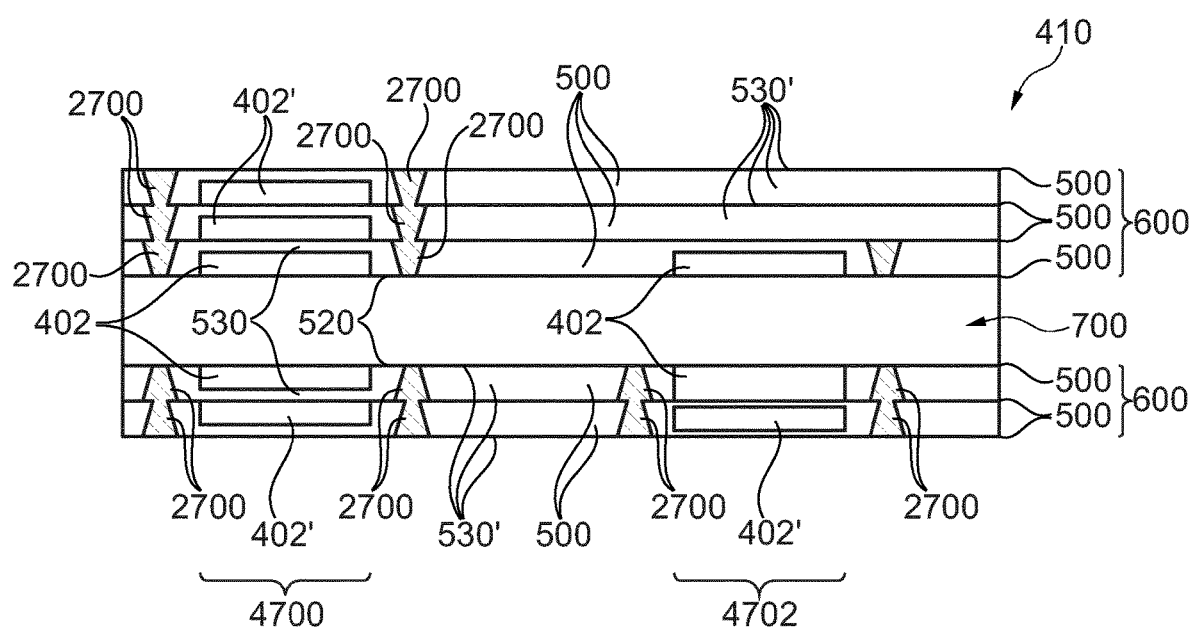
FIG. 47 shows a cross sectional view of a semifinished product with three dimensionally stacked electronic components on both opposing main surfaces of a sacrificial core according to an exemplary embodiment of the invention.

Although not shown in FIG. 22, it is optionally possible to mount one or more layers of additional electronic components 402 (see reference numeral 402' in FIG. 47) on the two opposing main surfaces of the semifinished product 410 of FIG. 22. By taking this measure, it is possible to build up a three dimensionally stacked semifinished products 410 with pre-forms of component carriers 600 on both opposing main surfaces of the sacrificial core 700, similar as shown in FIG. 47. Additionally, one or more electrically insulating layer structures 500 and/or electrically conductive layer structures may be arranged on such layers of additional electronic components 402, thereby also covering the first part and the second part of the cover structure 530. Thus, the mentioned additional electronic components 402 and the additional one or more electrically insulating layer structures 500 and/or electrically conductive layer structures may be connected to the top and the bottom of the semifinished product 410 shown in FIG. 22 by lamination, i.e. by the application of heat and pressure. By taking this measure, three dimensionally stacked arrangements of electronic components 402 in a component carrier 600 may be constructed.

As can be taken from FIG. 23, two semifinished products 410 of the type shown in FIG. 23 (wherein only one of the two identical semifinished products 410 is shown) can be delaminated from the release layers 704, 706. Advantageously, the described manufacturing procedure provides a PCB designer with the freedom to configure each respective one of the two delaminated semifinished products 410 according to FIG. 23 asymmetrically in a stacking direction of its layers, thanks to the implementation of the sacrificial core 700.

Figure 24:
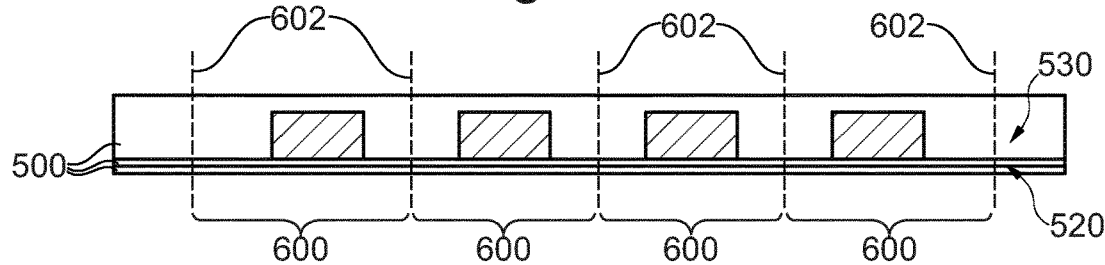

As can be taken from FIG. 24, a plurality of component carriers 600 may be obtained by singularizing the semifinished product 410 shown in FIG. 23 along separation lines 602. This can be accomplished by sawing, cutting or etching. The sacrificial core 700 can then be disposed or reused for manufacturing a new batch of component carriers 600.

Figure 25:
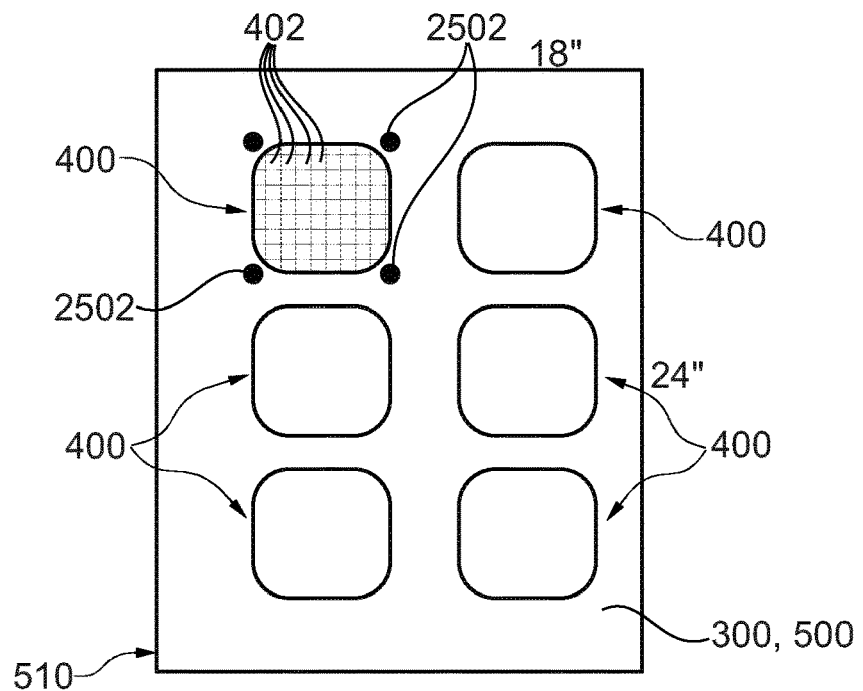
FIG. 25 shows a plan view of a panel on which six full semiconductor wafers are placed.

FIG. 25 shows a plan view of a panel 510 with a dimension of 18 inch×24 inch (or 24 inch×21 inch, or any other form typically used in PCB and substrate manufacturing) on which six wafer structures 400, here embodied as full semiconductor wafers, are placed. This placement is performed with the integral wafer structures 400, i.e. before singularization of the individual electronic components 402 thereof, which is only carried out after a double sided lamination of the wafer structures 400. The structure shown in FIG. 25 may be used as a basis for a manufacturing procedure according to FIG. 1 to FIG. 6. Alignment markers 2502 are shown in FIG. 25 which simplify precise processing of the panel 510 with the wafer structures 400 placed thereon, in particular in terms of laser drilling, etc. FIG. 25 relates to a fan-in architecture and allows for a coreless panel wafer packaging.

Figure 26:
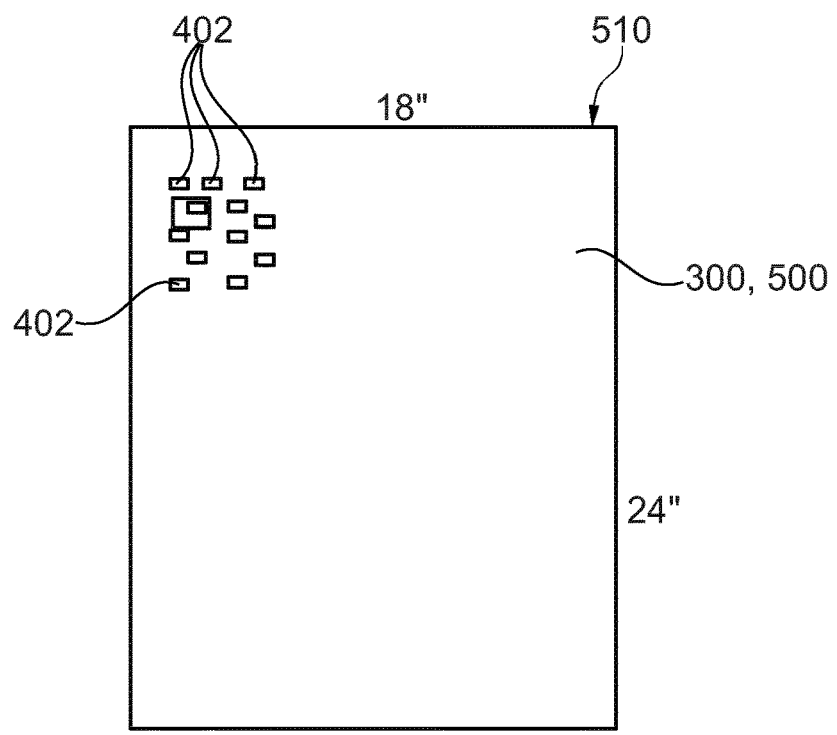
FIG. 26 shows a plan view of a panel with a dimension of 18 inch×24 inch.

FIG. 26 shows a plan view of a panel 510 with a dimension of 18 inch×24 inch (or 24 inch×21 inch, or any other form typically used in PCB and substrate manufacturing). A plurality of already singularized electronic components 402 (embodied as a single dies) are placed on the panel 510 with a gap in between them. The structure shown in FIG. 26 can form the basis of a manufacturing procedure according to FIG. 13 to FIG. 18. FIG. 26 relates to a fan-out architecture and allows for a coreless panel die packaging.

Figure 27:
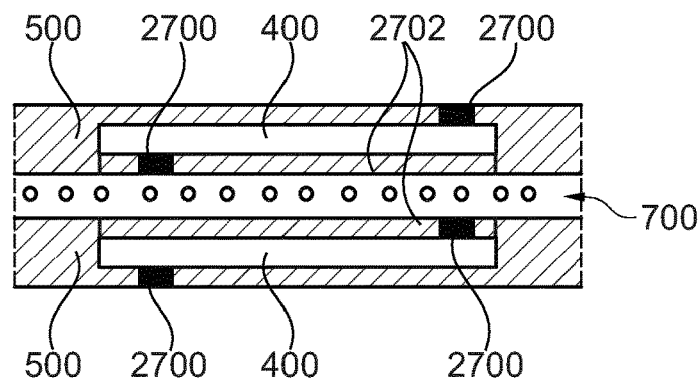
FIG. 27 shows a cross-sectional view of a structure which substantially corresponds to the structure shown in FIG. 10.

The cross-sectional view of the structure shown in FIG. 27 substantially corresponds to the structure shown in FIG. 10. However, according to FIG. 27, vertical through connections 2700 in form of vias are shown in order to interconnect various layers and features of the shown structure. Hence, the manufacturing method may further comprise forming, in particular prior to the singularizing, the through connections 2700 extending through the electrically insulating and/or electrically conductive layer structures 500. For instance, single ply prepreg may be used for the electrically insulating material. FIG. 27 also shows glue 2702 used for attaching the wafer structures 400 to the sacrificial core 700. After delaminating the upper body from the sacrificial core 700 and after turning this body by 180°, wafer pads are accessible from exterior.

Figure 28:
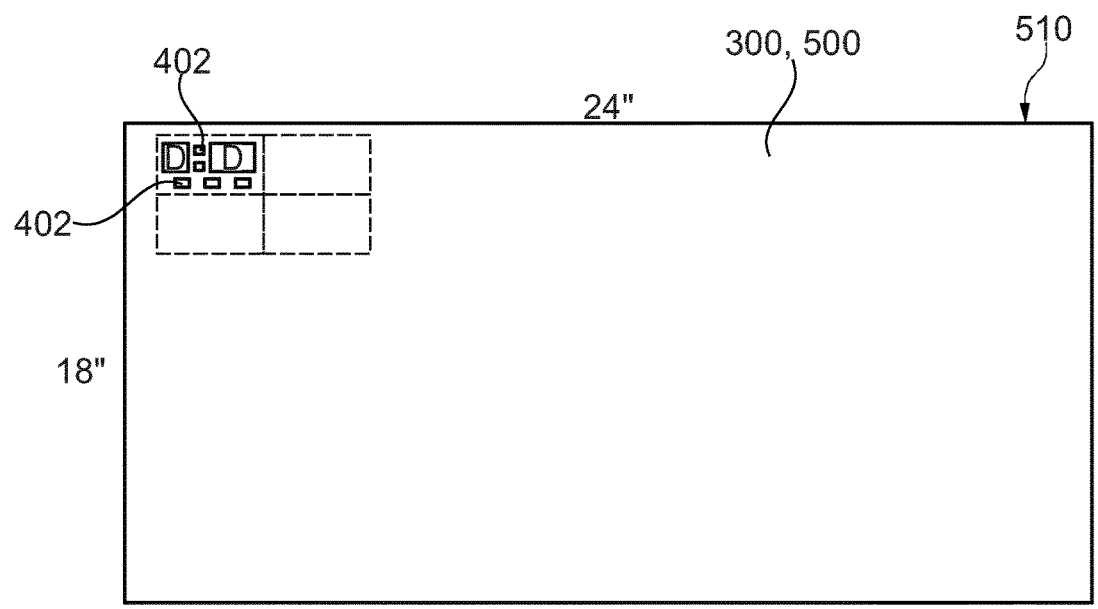
FIG. 28 shows a plan view of a panel having a dimension of 18"×24".

FIG. 28 shows a plan view of a panel 510 having a dimension of 18"×24", wherein a portion thereof is covered with various electronic chips 402. The embodiment of FIG. 28 relates fan-out multi-chip coreless panel die packaging.

Figure 29:
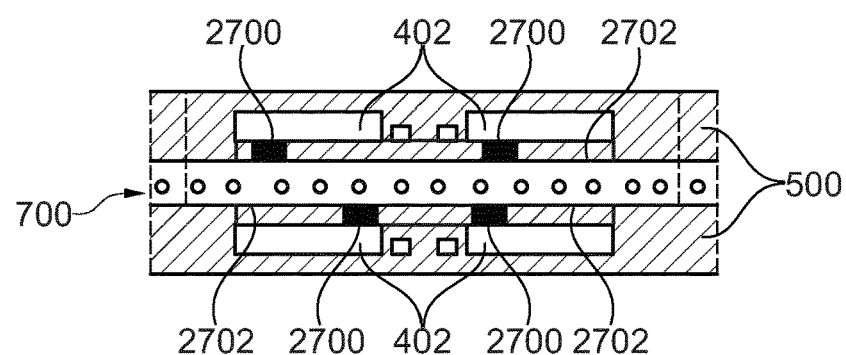
FIG. 29 shows a structure which substantially corresponds to the structure shown in FIG. 22.

The structure shown in FIG. 29 substantially corresponds to the structure shown in FIG. 22, but additionally comprises vertical interconnects 2700, i.e. copper filled (for instance plated) recesses (for instance mechanically drilled or laser drilled recesses) in electrically insulating layer structures 500. For instance, single ply prepreg or FR4 may be used for the electrically insulating material. FIG. 29 also shows glue 2702 used for attaching the electronic components 402 to the sacrificial core 700. After delaminating the upper body from the sacrificial core 700 and after turning this body by 180°, die pads are accessible from exterior.

Figure 30:
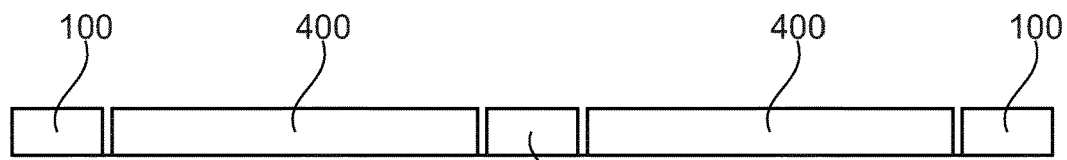
FIG. 30 shows wafer structures embedded in recesses of a recessed dummy core.

FIG. 30 shows wafer structures 400, such as full wafers, embedded in recesses 200 (compare FIG. 2) of a recessed dummy core 100. The recessed dummy core 100 may be manufactured by milling a dummy core 100 (as shown in FIG. 1).

Figure 31:
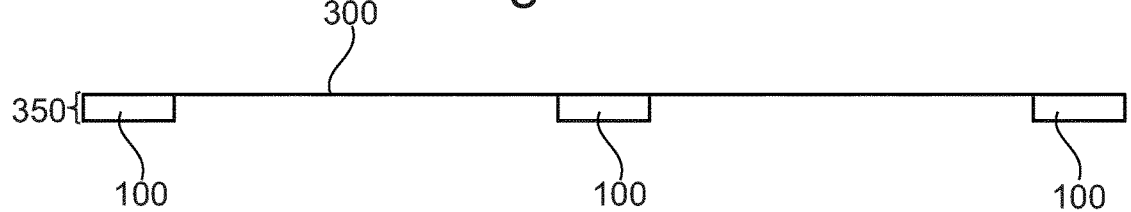
FIG. 31 shows sections of dummy core connected to an RCC foil.

FIG. 31 shows sections of dummy core 100 connected to an RCC foil 300, thereby forming common support structure 350. Thus, the recessed dummy core 100 and the RCC foil 300 may be pre-pressed.

Figure 32:
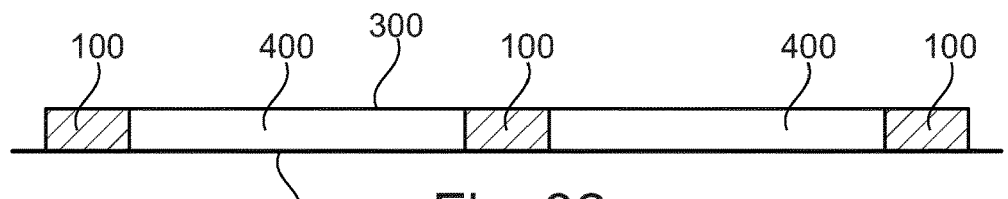
FIG. 32 shows the structure of FIG. 31 with wafer structures embedded in the recesses of the dummy core.

FIG. 32 shows the structure of FIG. 31 with wafer structures 400 embedded in the recesses of the dummy core 100. Furthermore, a further RCC foil 404 is pressed together with the structure shown in FIG. 31 and the wafer structures 400.

Figure 33:
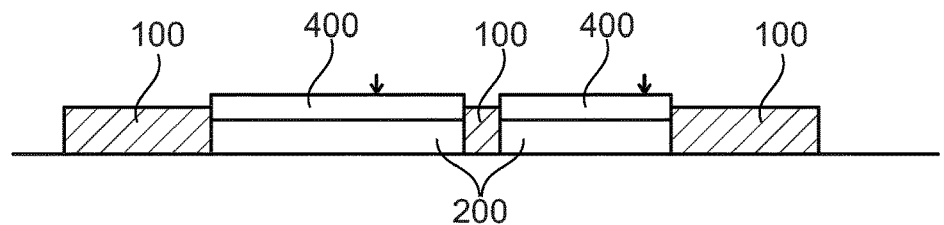
FIG. 33 illustrates the process of inserting the wafer structures into the recesses of the recessed dummy core.

FIG. 33 illustrates the process of inserting the wafer structures 400 into the recesses 200 of the recessed dummy core 100. This may be supported by a plate on the bottom side.

Figure 34:
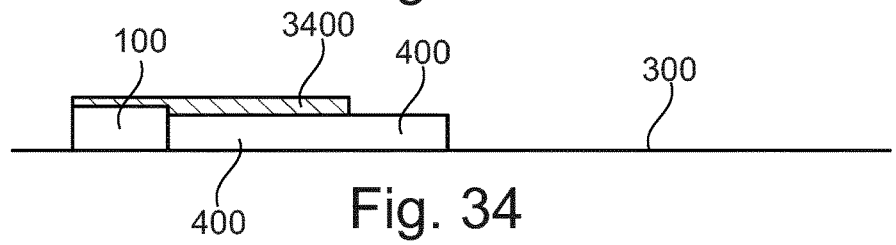
FIG. 34 shows a detailed view of the above described structures.

FIG. 34 shows a detailed view of the above described structures. In particular, FIG. 34 shows that in the scenario of a height difference between the dummy core 100 and the wafer structure 400, such height differences may be equilibrated by an auxiliary structure 3400. For instance, a single ply FR4 support structure may be used for this purpose.

Figure 35:
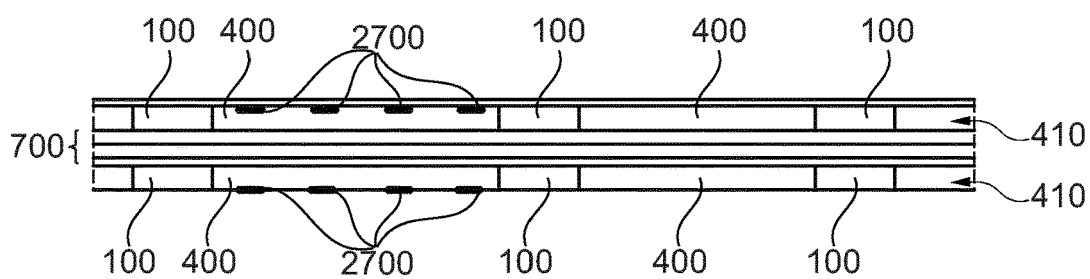
FIG. 35 shows a cross-sectional view in which semifinished products are formed on both opposing main surfaces of a sacrificial core.

FIG. 35 shows a cross-sectional view of another embodiment in which semifinished products 410 are formed on both opposing main surfaces of a sacrificial core 700.

Figure 36:
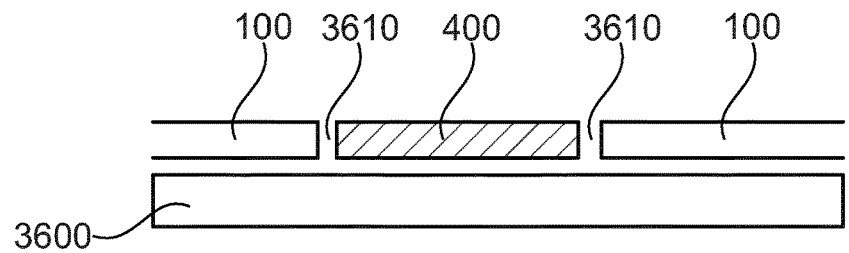
FIG. 36 and FIG. 37 show lateral spacers or gaps between the a dummy core and wafer structures.
Figure 37:
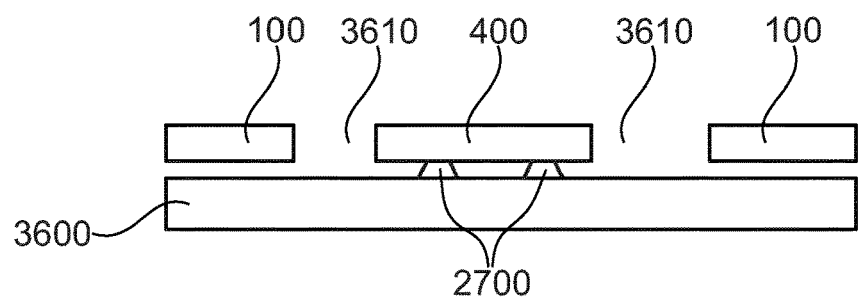

FIG. 36 and FIG. 37 show lateral spacers 3610 or gaps between the dummy core 100 and the wafer structures 400 above a structure 3600. FIG. 37 additionally shows vertical through connections 2700.

Figure 38:
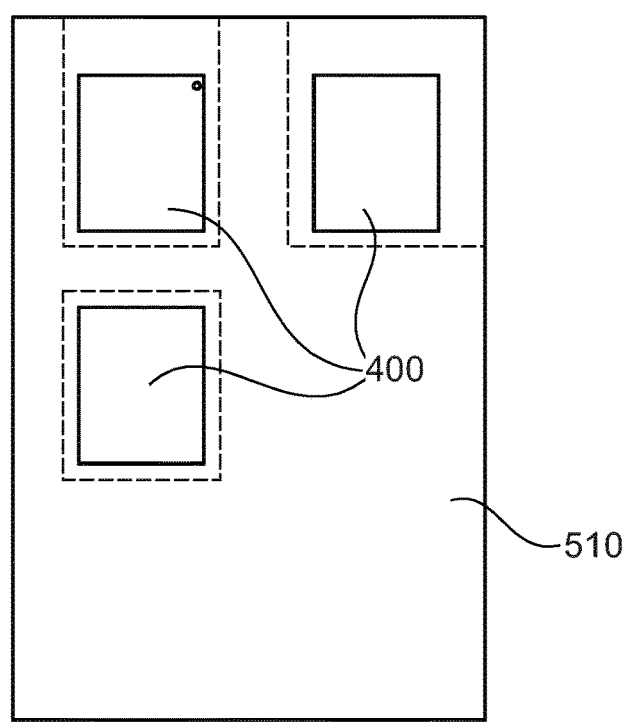
FIG. 38 shows multiple wafer structures on a common panel.

FIG. 38 shows multiple wafer structures 400 on a common panel 510. As an alternative to the wafer structures 400, it is also possible that individual electronic components 402 (in particular semiconductor chips) are arranged on the common panel 510 (not shown in FIG. 38). As a common panel 510, it is possible to use an aluminum carrier or a copper carrier. As indicated with rectangles around the wafer structures 400, varnish may be applied on the wafer structures 400.

Figure 39:
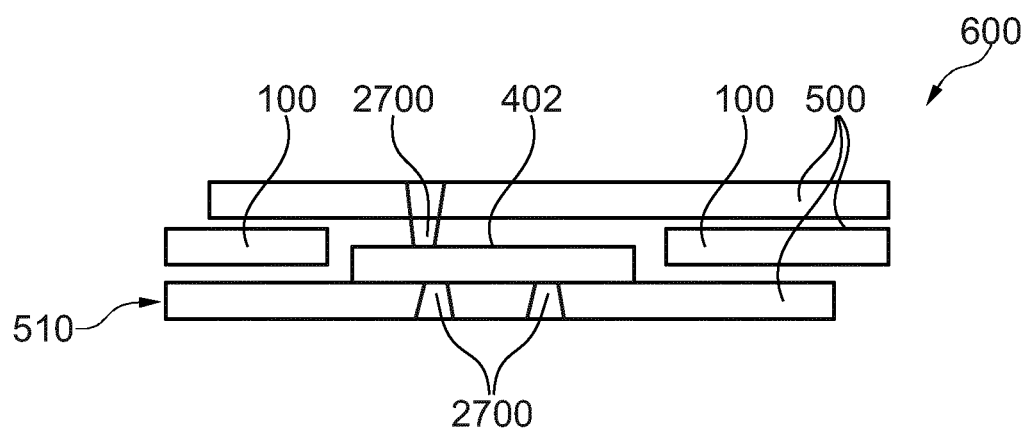
FIG. 39 shows a cross-sectional view of a component carrier according to an exemplary embodiment of the invention.

FIG. 39 shows a cross-sectional view of a component carrier 600 according to an exemplary embodiment of the invention with vertical through connections 2700 for electrically connecting both a lower main surface and an upper main surface of electronic component 402 laterally embedded between different portions of core 100 (here forming part of the final component carrier 600). In the shown embodiment, the electronic component 402 (for instance a power semiconductor device) may have two active regions, one on the upper main surface and one on the lower main surface.

Figure 40:
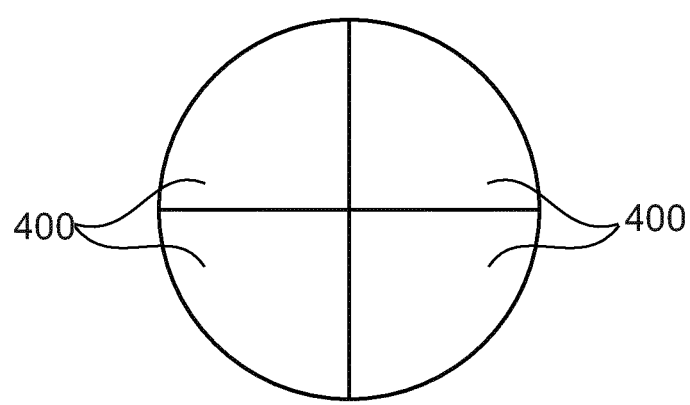
FIG. 40 shows a plan view of a full circular wafer which is divided into four equal wafer structures.

FIG. 40 shows a plan view of a full circular wafer which is here divided into four equal wafer structures 400 each forming a circular sector with an angle of 90°. Arranging quarter circle shaped wafer structures 400 (and/or other wafer sectors) on a rectangular common panel 510 allows to more efficiently use the available surface of the common panel 510, since the surface portion of the common panel 510 which remains unused is reduced as compared to the arrangement of a plurality of full circular wafers on the rectangular common panel 510.

Figure 41:
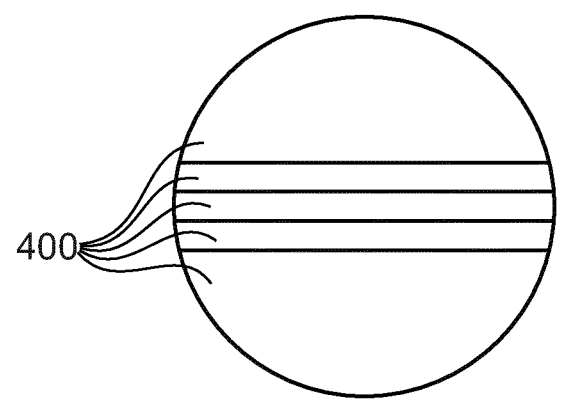
FIG. 41 shows a plan view of a full wafer which is divided into separate wafer structures according to another exemplary embodiment of the invention.

FIG. 41 shows a plan view of a full wafer which is divided into separate wafer structures 400 according to another exemplary embodiment of the invention. Three central ones of the shown wafer structures 400 are shaped as substantially stripe-like wafer structures 400. The upper and the lower wafer structures 400 shown in FIG. 41 are configured as a respective circular segment. Also with stripe-like and circular segmented wafer structures 400, the surface area on a rectangular common panel 510 can be used more efficiently than arranging full circular wafers thereon.

Figure 42:
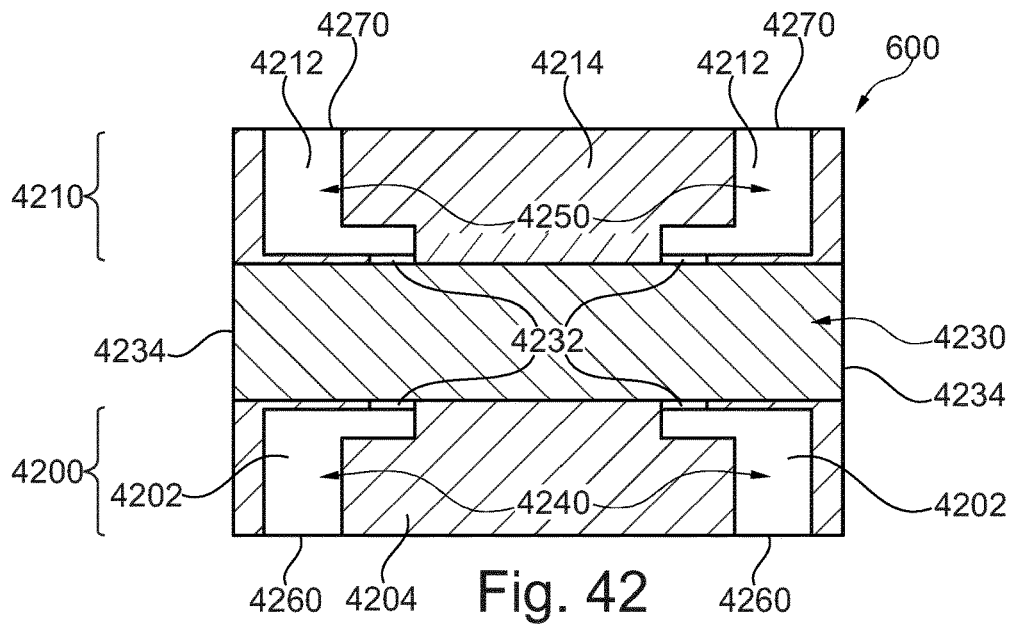
FIG. 42 shows a cross-sectional view of a component carrier with exposed lateral semiconductor surfaces of a bare die according to an exemplary embodiment of the invention.

FIG. 42 shows a cross-sectional view of a component carrier 600 with exposed lateral semiconductor surfaces 4234 of a bare die 4230 as electronic component according to an exemplary embodiment of the invention. The component carrier 600 according to FIG. 42 may be obtained for example by a manufacturing procedure as described referring to FIG. 1 to FIG. 6 or referring to FIG. 7 to FIG. 12.

The component carrier 600 comprises a base laminate 4200 comprising a laminated stack of an electrically conductive layer structure 4202 and an electrically insulating layer structure 4204. The base laminate 4200 may form part of base structure 510 (compare FIG. 6 or FIG. 12). Furthermore, component carrier 600 comprises a cover laminate 4210 comprising a laminated stack of an electrically conductive layer structure 4212 and an electrically insulating layer structure 4214. The cover laminate 4210 may form part of cover structure 530 (compare FIG. 6 or FIG. 12). Bare die 4230 with pads 4232 on an upper main surface and on a lower main surface is sandwiched and laminated between the base laminate 4200 and the cover laminate 4210. The bare die 4230 may correspond to one of the electronic chips 402 shown in FIG. 6 or FIG. 12. As can be taken from FIG. 42, a lateral semiconductor surface 4234 of the bare die 4230 is exposed from the base laminate 4200 and the cover laminate 4210. This is a consequence of the singularization procedure shown in FIG. 6 or FIG. 12. According to FIG. 42, the lateral semiconductor surface 4234 forms part of an exterior surface of the component carrier 600 and is exposed to an environment.

As can be taken from FIG. 42, both the base laminate 4200 and the cover laminate 4210 forms a respective redistribution layer 4240, 4250 which spatially increases dimension and spacing of external electric contacts 4260, 4270 of the redistribution layers 4240, 4250 as compared to dimension and spacing between the pads 4232 of the bare die 4230. Thus, packaging the electronic chips 402 with laminate material on top and on bottom may be carried out advantageously simultaneously with the formation of redistribution layers 4240, 4250. The interconnected layer stack according to FIG. 42 may be interconnected by the application of pressure, by the application of elevated temperature, or by the combined application of pressure and elevated temperature. As an alternative to the two-sided provision of pads 4232, it is also possible that pads 4232 are formed only on an upper main surface or only on a lower main surface of the bare die 4230.

Figure 43:
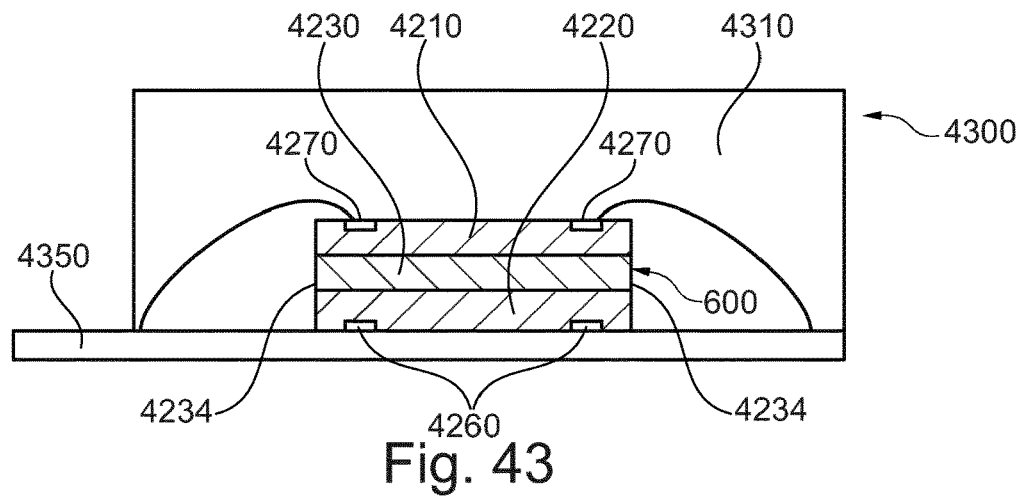
FIG. 43 shows a cross-sectional view of the component carrier according to FIG. 42 covered by protective material and mounted on a carrier.

FIG. 43 shows a cross-sectional view of the component carrier 600 according to FIG. 42 covered by protective material 4310 and mounted on a carrier 4350. According to FIG. 43, the lateral semiconductor surface 4234 is covered by protective material 4310. Protective material 4310 may be laminate or mold compound.

Figure 44:
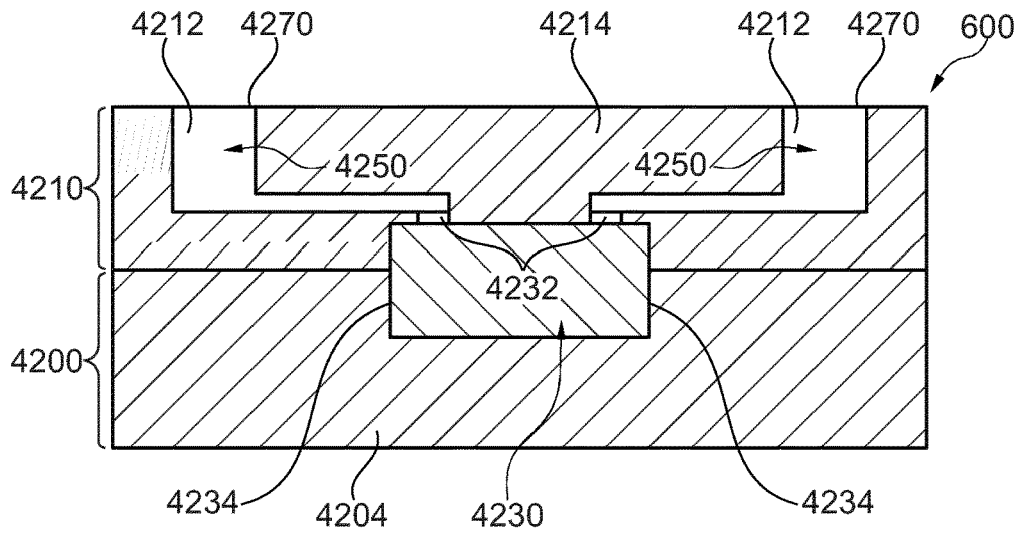
FIG. 44 shows a cross-sectional view of a component carrier with lateral semiconductor surfaces of a bare die fully embedded in a laminate according to an exemplary embodiment of the invention.

FIG. 44 shows a cross-sectional view of a component carrier 600 with lateral semiconductor surfaces 4234 of a bare die 4230 as electronic chip fully circumferentially embedded in a laminate (see reference numerals 4200, 4210) according to an exemplary embodiment of the invention. The component carrier 600 according to FIG. 44 may be obtained, for example, by carrying out the manufacturing procedure described referring to FIG. 14 to FIG. 18 or referring to FIG. 19 to FIG. 24. As an alternative to the one-sided provision of pads 4232 only on the upper main surface of the bare die 4230 as shown in FIG. 44, it is also possible that pads 4232 are formed on both opposing main surfaces of the bare die 4230 or only on a lower main surface of the bare die 4230. Also according to FIG. 44, a redistribution layer 4250 is formed by the lamination which spatially increases dimension and spacing of external electric contacts 4270 of the redistribution layer 4250 as compared to dimension and spacing between the pads 4232 of the bare die 4230. Thus, packaging the electronic chips 402 may be carried out advantageously simultaneously with the formation of redistribution layer 4250.

Figure 45:
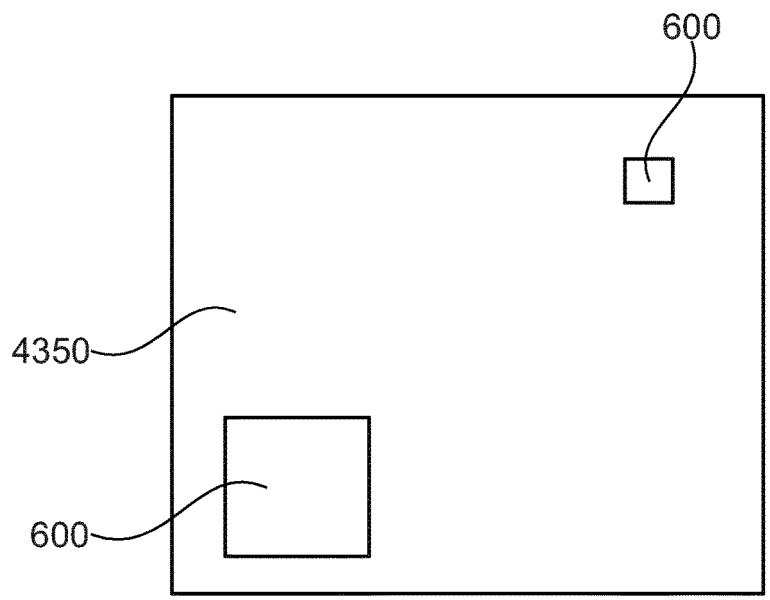
FIG. 45 shows a plan view of component carriers mounted on a carrier according to an exemplary embodiment of the invention.

FIG. 45 shows a plan view of two component carriers 600 mounted on a carrier 4350 according to an exemplary embodiment of the invention.

Figure 46:
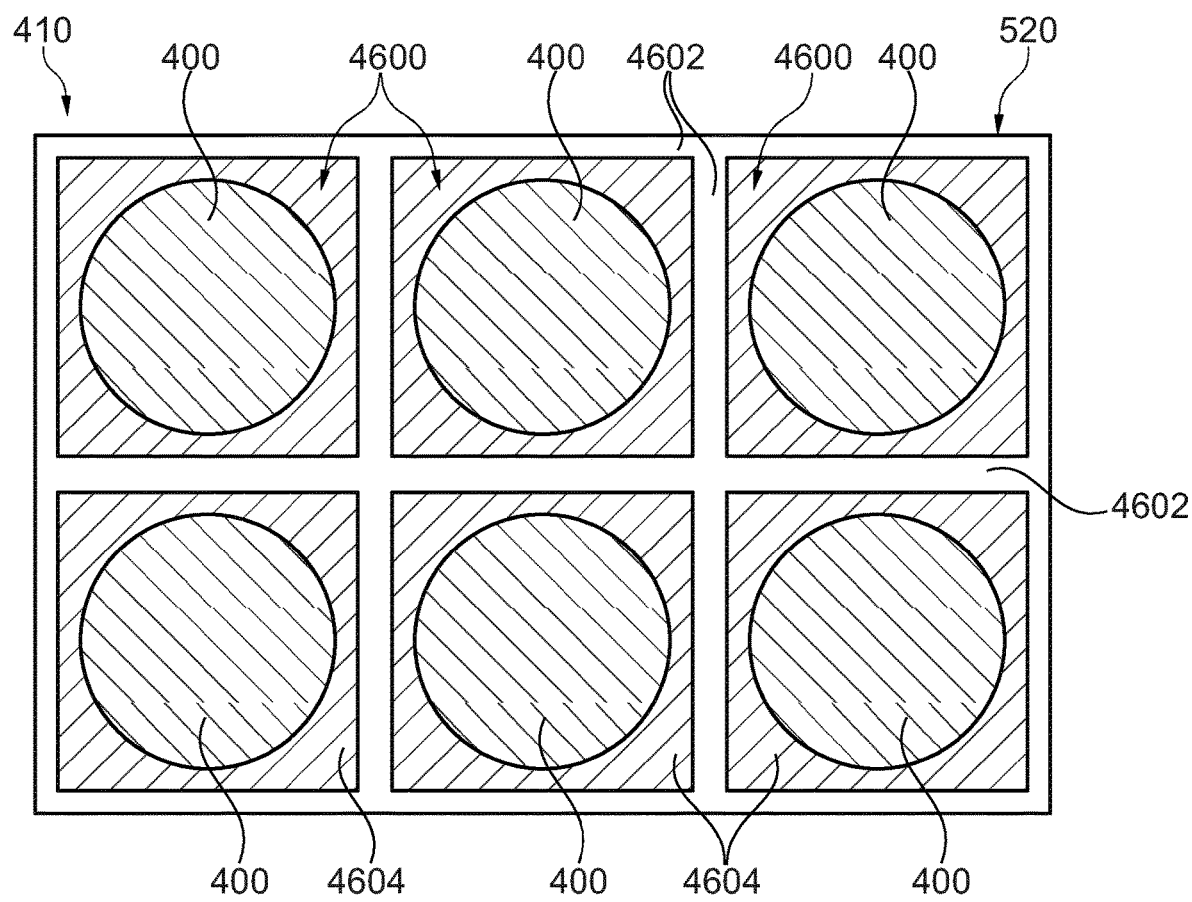
FIG. 46 shows a plan view of a semifinished product with multiple full wafers accommodated in accommodation compartments and being surrounded by release material according to an exemplary embodiment of the invention.

FIG. 46 shows a plan view of a semifinished product 410 with multiple full wafers as wafer structures 400 accommodated in accommodation compartments 4600 and being surrounded by release material 4604 according to an exemplary embodiment of the invention. In the shown embodiment, each of the plurality of separate wafer structures 400 is accommodated within a respective one of six accommodation compartments 4600 delimited by a frame structure 4602 of the base structure 520. The frame structure 4602 is composed of a circumferential annular structure as well as of webs connected to the annular structure. The frame structure 4602 (which may be made of prepreg material) projects beyond the remainder of the base structure 520 in a direction perpendicular to the paper plane of FIG. 46. Consequently, empty volumes of the accommodation compartments 4600 are filled with release material 4604 (such as Teflon or a release wax) surrounding the respective wafer structure 400. After completion of the manufacturing procedure, the wafer structures 400 covered on an upper main surface and on a lower main surface thereof with material of the base structure 520 and of the cover structure 530 can be easily separated from the release material 4604. For example, the release material 4604 may correspond to reference numeral 700 shown in FIG. 7. The provision of the frame structure 4602 in combination with the release material 4604 increases stability, simplifies handling and prevents the sensitive packaged wafer structures 520 against damage.

FIG. 47 shows a cross sectional view of a semifinished product 410 with three dimensionally stacked electronic components 402, 402' according to an exemplary embodiment of the invention.

The semifinished product 410 according to FIG. 47 comprises a base structure 520 (here embodied as electrically conductive base structure, for instance of copper) on a sacrificial core 700 and a plurality of separate electronic components 402 thereon. A cover structure 530 (here embodied as electrically insulating cover structure, for instance of resin) is arranged to cover the electronic components 402 and part of the base structure 520.

More specifically, the sacrificial core 700 has an upper first main surface and an opposing lower second main surface. A first part of the base structure 520 covers the first main surface, and a second part of the base structure 520 covers the second main surface. The electronic components 402 are arranged on the first part and on the second part of the base structure 520, respectively. A first part of the cover structure 530 covers the electronic components 402 on the first part of the base structure 520 and part of the first part of the base structure 520. Correspondingly, a second part of the cover structure 530 covers the electronic components 402 on the second part of the base structure 520 and part of the second part of the base structure 520.

In order to form a three-dimensional stack of electronic components 402, 402' on either of the main surfaces of the sacrificial core 700, the semifinished product 410 according to FIG. 47 further comprising further separate electronic components 402' on the cover structure 530, more precisely on both the first part and the second part of the cover structure 530. In the shown embodiment, two additional layers of further separate electronic components 402' are provided on the upper side of the sacrificial core 700, and one additional layer of further separate electronic components 402' is provided on the lower side of the sacrificial core 700. However, any other number of layers of further electronic components 402' may be provided on either sides of the sacrificial core 700. It is also possible that the buildup is symmetrical on both opposing main surfaces of the sacrificial core 700 (which suppresses warpage).

Moreover, a further cover structure 530' of electrically conductive materials and electrically insulating material is arranged to cover the further electronic components 402' and part of the cover structure 530 on both opposing main surfaces of the sacrificial core 700, as shown in FIG. 47.

After having completed the buildup, the component carriers 600 or packages on the upper side and on the lower side of the sacrificial core 700 may be removed from the sacrificial core 700. When the manufacturing procedure in a batch manufacturing procedure, singularization of individual component carriers 600 or packages may be accomplished prior or after the removal. With the architecture described referring to FIG. 47, it is hence possible to manufacture component carriers 600 or packages with any desired three-dimensional stacking of electronic components 402, 402'. It is for instance possible to manufacture stacks with 6, 8, 10, etc., or any other desired number of layers of electronic components 402, 402' on the sacrificial core 700 altogether, or even on each of the two opposing main surfaces of the sacrificial core 700. In order to electrically contact the buried or embedded electronic components 402, 402', vertically stacked through connections 2700 may be formed in the manner as shown in FIG. 47. These through connections 2700 in FIG. 47 may be denoted as through laminate vias (TLV). With the architecture described referring to FIG. 47, it is for instance possible to manufacture vertical stacks of memory chips 4700 (see stack of electronic components 402, 402' on the left-hand side of FIG. 47). Additionally or alternatively, it is possible to manufacture vertical stacks of logic chips 4702 (see stack of electronic components 402, 402' on the right-hand side of FIG. 47). The electronic components 402, 402' may be bare dies or may be already encapsulated chips.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A semifinished product, comprising a laminate of:
 a base structure comprising at least one electrically conductive layer structure and/or at least one electrically insulating layer structure;
 a plurality of separate wafer structures, each comprising a plurality of electronic components, arranged on the base structure; and
 a cover structure comprising at least one further electrically conductive layer structure and/or at least one further electrically insulating layer structure and being arranged to cover the wafer structures and part of the base structure,
 wherein the semifinished product further comprises at least one of the following features:
 a sacrificial core having a first main surface and an opposing second main surface, wherein:
  a first part of the base structure covers the first main surface,
  a second part of the base structure covers the second main surface,
  at least one of the wafer structures is arranged on the first part of the base structure,
  at least another one of the wafer structures is arranged on the second part of the base structure,
  a first part of the cover structure covers the at least one of the wafer structures and part of the first part of the base structure,
  a second part of the cover structure covering the at least one other of the wafer structures and part of the second part of the base structure;
 all wafer structures are arranged within a common plane;
 each of the plurality of separate wafer structures is accommodated within an accommodation compartment delimited by a protruding frame structure wherein at least part of the accommodation compartment is partially filled with release material surrounding at least part of the respective wafer structure.

2. A semifinished product, comprising a laminate of:
 a base structure having a common panel comprising at least one electrically conductive layer structure and/or at least one electrically insulating layer structure;
 a plurality of separate electronic components, configured as bare dies with pads, on the common panel; and
 a cover structure comprising at least one further electrically conductive layer structure and/or at least one further electrically insulating layer structure and being arranged to cover the electronic components and part of the base structure;

wherein at least part of the one or more electrically conductive layer structures and/or at least part of the one or more electrically insulating layer structures form a redistribution layer on the bare dies, wherein the semifinished product further comprises at least one of the following features:

the semifinished product further comprises a sacrificial core having a first main surface and an opposing second main surface, wherein:
- a first part of the base structure covers the first main surface,
- a second part of the base structure covers the second main surface,
- at least two of the electronic components are arranged on the first part of the base structure,
- at least two other of the electronic components are arranged on the second part of the base structure,
- a first part of the cover structure covers the at least two of the electronic components and part of the first part of the base structure,
- a second part of the cover structure covers the at least two other of the electronic components and part of the second part of the base structure;

the at least one electrically insulating layer structure comprises at least one of a group consisting of resin, Bismaleimide-Triazine resin, cyanate ester, glass, glass fibers, prepreg material, polyimide, polyamide, polytetrafluoroethylene, liquid crystal polymer, epoxy-based Build-Up Film, FR4 material, FR5 material, a ceramic, and a metal oxide;

the at least one electrically conductive layer structure comprises at least one of a group consisting of copper, aluminum, and nickel;

the semifinished product further comprising:
- at least one further plurality of separate electronic components configured as bare dies with pads, on the cover structure,
- a further cover structure comprising at least one further electrically conductive layer structure and/or at least one further electrically insulating layer structure and being arranged to cover the further electronic components and part of the cover structure;
- at least two of the further electronic components are arranged on the first part of the cover structure,
- at least two other of the further electronic components are arranged on the second part of the cover structure,
- a first part of the further cover structure covers the at least two of the further electronic components and part of the first part of the cover structure,
- a second part of the further cover structure covers the at least two other of the further electronic components and part of the second part of the cover structure.

3. A component carrier, comprising:
a base laminate comprising a laminated stack of at least one electrically conductive layer structure and/or at least one electrically insulating layer structure;
a cover laminate comprising a laminated stack of at least one electrically conductive layer structure and/or at least one electrically insulating layer structure;
a bare die with pads, wherein the bare die is laminated between the base laminate and the cover laminate and has a lateral semiconductor surface being exposed from the base laminate and the cover laminate,
wherein the component carrier further comprises at least one of the following features:
- the lateral semiconductor surface is at least partially covered by protective material;
- the lateral semiconductor surface forms part of an exterior surface of the component carrier and is exposed to an environment;
- at least one of the base laminate and the cover laminate forms at least part of a redistribution layer which spatially increases dimension and spacing of external electric contacts of the redistribution layer as compared to dimension and spacing between pads of the bare die.

* * * * *